(12) United States Patent
Bang et al.

(10) Patent No.: US 11,995,281 B2
(45) Date of Patent: May 28, 2024

(54) DISPLAY DEVICE

(71) Applicant: Samsung Display Co., Ltd., Yongin-Si (KR)

(72) Inventors: Gyeong Nam Bang, Seoul (KR); Deok Jung Kim, Cheonan-si (KR); Eun Young Kim, Asan-si (KR); Hye Yun Han, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 25 days.

(21) Appl. No.: 17/698,007

(22) Filed: Mar. 18, 2022

(65) Prior Publication Data

US 2022/0350445 A1 Nov. 3, 2022

(30) Foreign Application Priority Data

Apr. 30, 2021 (KR) .................. 10-2021-0056800

(51) Int. Cl.
*G06F 3/044* (2006.01)
*G06F 3/041* (2006.01)
*H10K 59/122* (2023.01)
*H10K 59/40* (2023.01)

(52) U.S. Cl.
CPC .......... *G06F 3/0446* (2019.05); *G06F 3/0412* (2013.01); *H10K 59/122* (2023.02); *H10K 59/40* (2023.02)

(58) Field of Classification Search
CPC ......... G06F 2203/04112; G06F 3/0412; G06F 3/04164; G06F 3/0445; G06F 3/0446; G06F 3/0448; G06F 2203/04111
See application file for complete search history.

(56) References Cited

U.S. PATENT DOCUMENTS 11,194,436 B2 12/2021 Do et al.
11,320,944 B2 5/2022 Ko et al.
11,409,401 B2 8/2022 Hyun et al.
(Continued)

FOREIGN PATENT DOCUMENTS

CN 104199583 A 12/2014
CN 108054193 A 5/2018
(Continued)

OTHER PUBLICATIONS

PCT/KR2022/010465, PCT-Search-Report dated Dec. 15, 2022, 8 pages.

*Primary Examiner* — Robin J Mishler
(74) *Attorney, Agent, or Firm* — Innovation Counsel LLP

(57) ABSTRACT

A display device is provided. The display device includes a first sensing electrode extending in a first direction, the first sensing electrode including a first sub-sensing electrode and a second sub-sensing electrode spaced apart from each other in a touch area which senses a touch input; a second sensing electrode extending in a second direction intersecting the first direction, the second sensing electrode including a third sub-sensing electrode and a fourth sub-sensing electrode spaced apart from each other in the touch area; a first touch signal line connected to the first sub-sensing electrode and the second sub-sensing electrode; and a second touch signal line connected to the third sub-sensing electrode and the fourth sub-sensing electrode.

14 Claims, 17 Drawing Sheets

(56) References Cited

U.S. PATENT DOCUMENTS

| | | | | |
|---|---|---|---|---|
| 2011/0227858 | A1* | 9/2011 | An | G06F 3/0317 |
| | | | | 345/173 |
| 2016/0085334 | A1* | 3/2016 | Hashimoto | G06F 3/0443 |
| | | | | 345/174 |
| 2018/0074609 | A1* | 3/2018 | Jeon | G06F 3/0448 |
| 2022/0028935 | A1 | 1/2022 | Park et al. | |

FOREIGN PATENT DOCUMENTS

| | | |
|---|---|---|
| CN | 111857445 A | 10/2020 |
| KR | 2017-0014658 A | 2/2017 |
| KR | 10-2020-0135634 A | 12/2020 |
| KR | 2021-0037299 A | 4/2021 |
| KR | 2021-0125649 A | 10/2021 |
| KR | 2022-0004895 | 1/2022 |
| KR | 2022-0012455 A | 2/2022 |

* cited by examiner

EMA: EMA_B, EMA_R, EMA_G

DISPLAY DEVICE

CROSS-REFERENCE TO RELATED APPLICATION

This application claims priority to Korean Patent Application No. 10-2021-0056800 filed on Apr. 30, 2021, in the Korean Intellectual Property Office, and all the benefits accruing therefrom under 35 U.S.C. 119, the contents of which in its entirety are herein incorporated by reference.

BACKGROUND

1. Field

The present disclosure relates to a display device.

2. Description of Related Art

As information society develops, demand for a display device for displaying an image is increasing in various forms. For example, the display device is applied to various electronic devices such as smart phones, digital cameras, notebook computers, navigation systems, smart televisions, and vehicle dashboards.

The display device may include various types of the display devices such as a liquid crystal display device and an organic light-emitting display device. The organic light-emitting display device displays an image using an organic light-emissive element that generates light via recombination of electrons and holes. The organic light-emitting display device includes a plurality of transistors that provide a driving current to the organic light-emissive element.

The display device includes a display panel that generates and displays an image and various input devices. Recently, a touch panel that recognizes a touch input is widely applied to a display device of a smart phone, a tablet PC, and a smart watch. As the display device is applied to various electronic devices, research to prevent a touch failure is continuously being conducted.

SUMMARY

A purpose of the present disclosure is to provide a display device that may prevent a touch failure.

Purposes according to the present disclosure are not limited to the above-mentioned purpose. Other purposes and advantages according to the present disclosure that are not mentioned may be understood based on following descriptions, and may be more clearly understood based on embodiments according to the present disclosure. Further, it will be easily understood that the purposes and advantages according to the present disclosure may be realized using means shown in the claims and combinations thereof.

An embodiment of a display device includes a first sensing electrode extending in a first direction, the first sensing electrode including a first sub-sensing electrode and a second sub-sensing electrode spaced apart from each other in a touch area which senses a touch input; a second sensing electrode extending in a second direction intersecting the first direction, the second sensing electrode including a third sub-sensing electrode and a fourth sub-sensing electrode spaced apart from each other in the touch area; a first touch signal line connected to the first sub-sensing electrode and the second sub-sensing electrode; and a second touch signal line connected to the third sub-sensing electrode and the fourth sub-sensing electrode.

An embodiment of a display device includes a substrate; an anode disposed on the substrate; a pixel defining layer disposed on the anode, and having an opening exposing the anode; a light-emissive layer disposed on the anode in the opening of the pixel defining layer; a cathode disposed on the light-emissive layer; an encapsulation layer disposed on the cathode; and a first touch conductive layer disposed on the encapsulation layer, wherein the first touch conductive layer includes a first sensing electrode extending in a first direction, and a second sensing electrode extending in a second direction intersecting the first direction, wherein the first sensing electrode includes a first sub-sensing electrode and a second sub-sensing electrode spaced apart from each other in a touch area which senses a touch input, and wherein the second sensing electrode includes a third sub-sensing electrode and a fourth sub-sensing electrode spaced apart from each other in the touch area.

An embodiment of a display device includes a touch area having a circular shape and sensing a touch input; a first sensing electrode disposed in the touch area, and extending in the first direction; and a second sensing electrode disposed in the touch area, and extending in a second direction intersecting the first direction, wherein the touch area includes an inner area having a rectangular shape and an outer area disposed outside of the inner area, the outer area including a portion enclosed by an arc and a line connecting distal ends of the arc, and wherein at least one of the first sensing electrode and the second sensing electrode disposed in the outer area includes sub-sensing electrodes spaced apart from each other in the touch area.

According to the display device according to one embodiment, the touch failure may be prevented.

Effects of the present disclosure are not limited to the above-mentioned effects, and other effects as not mentioned will be clearly understood by those skilled in the art from following descriptions.

BRIEF DESCRIPTION OF DRAWINGS

The above and other aspects and features of the present disclosure will become more apparent by describing in detail embodiments thereof with reference to the attached drawings, in which.

DETAILED DESCRIPTIONS

The present inventive concept will now be described more fully hereinafter with reference to the accompanying drawings, in which preferred embodiments of the inventive concept are shown. This inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. The same reference numbers indicate the same components throughout the specification. In the attached figures, the thickness of layers and regions is exaggerated for clarity.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

Hereinafter, specific embodiments will be described with reference to the accompanying drawings.

Figure 1:
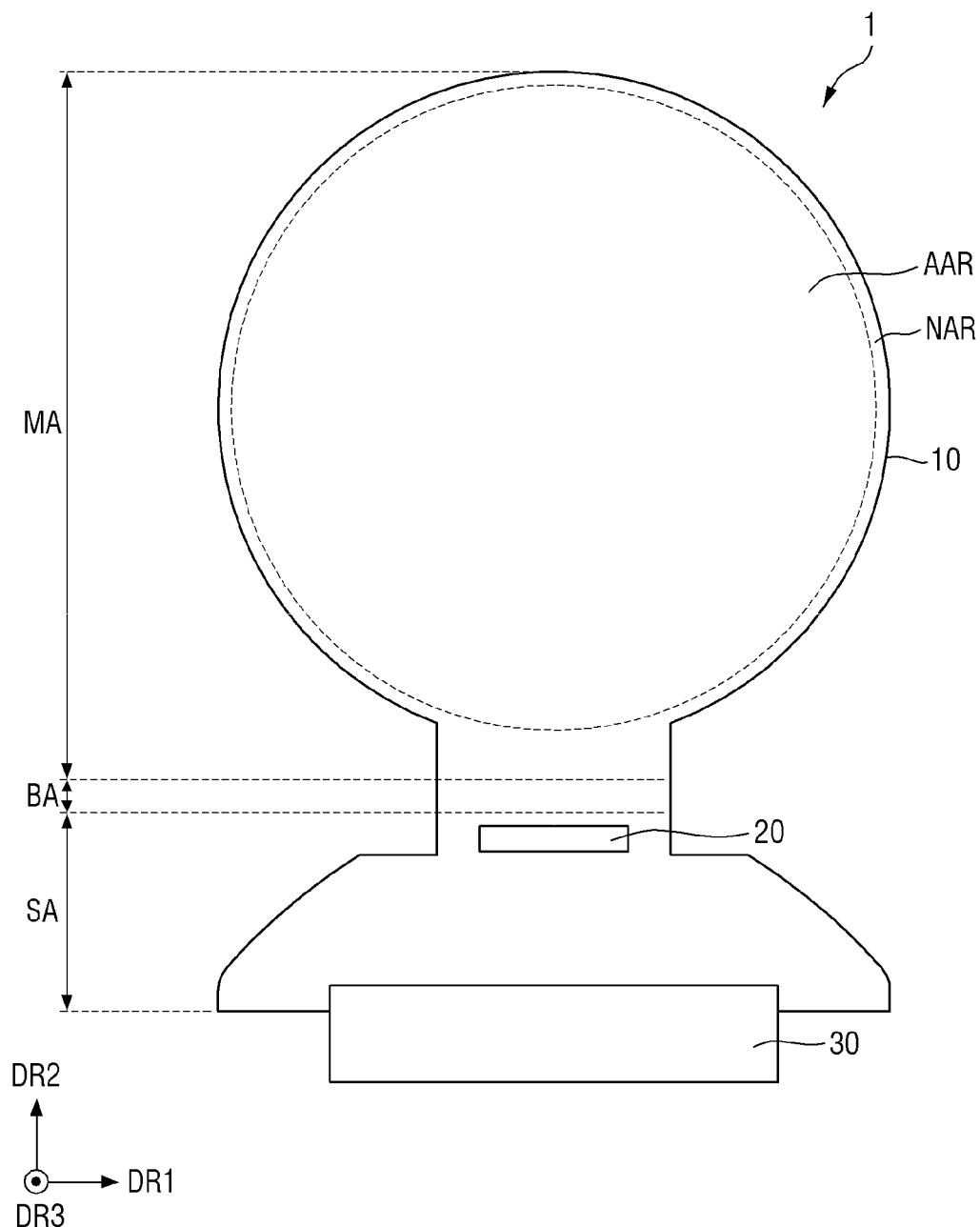
FIG. 1 is a plan layout diagram of a display device according to one embodiment.
Figure 2:
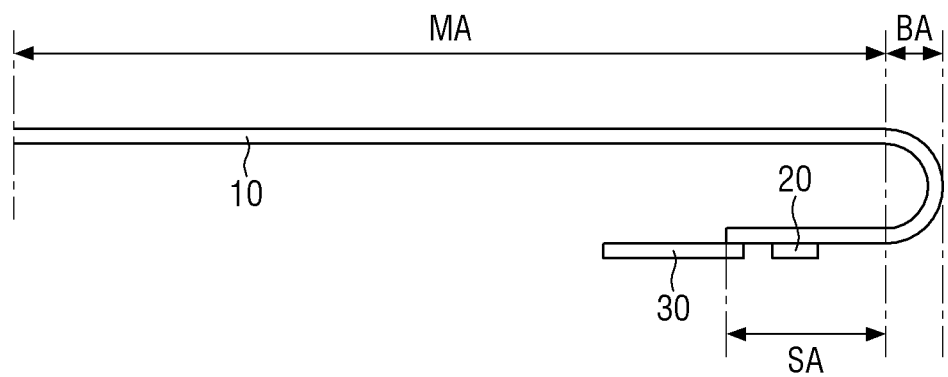
FIG. 2 is a schematic cross-sectional view of a portion of a display device according to one embodiment.
Figure 2:
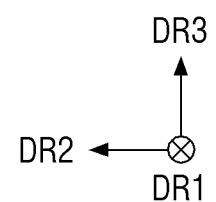

FIG. 1 is a plan view of a display device according to one embodiment. FIG. 2 is a schematic cross-sectional view of a portion of a display device according to one embodiment.

In embodiments, a first direction DR1 and a second direction DR2 respectively represent directions that are perpendicular to each other in a plan view. A third direction DR3 refers to a direction intersecting a plane determined by the first direction DR1 and the second direction DR2 lie, for example, represents a direction normal to the plane on which the first direction DR1 and the second direction DR2 lie. In the illustrated drawing, the first direction DR1 represents a horizontal direction of the display device 1, the second direction DR2 represents a vertical direction of the display device 1, and the third direction DR3 represents a thickness direction of the display device 1.

In following embodiments, one side in the first direction DR1 refers to a right side in a plan view, an opposite side in the first direction DR1 refers to a left side in a plan view, one side in the second direction DR2 refers to an upper side in a plan view, an opposite side in the second direction DR2 refers to a lower side in a plan view, one side in the third direction DR3 refers to a top side in the cross-sectional view, and an opposite side in the third direction DR3 refers to a bottom side in the cross-sectional view.

In addition, herein, unless otherwise defined, a top face or a top side in the third direction DR3 refers to a display face of a display panel 10, while a bottom face or a bottom side in the third direction DR3 is opposite to the display face of the display panel 10. However, it should be understood that the direction mentioned in the embodiment refers to a relative direction. Thus, the embodiment is not limited to the direction as mentioned.

Referring to FIG. 1 and FIG. 2, a display device 1 may refer to any electronic device that provides a display screen. For example, the display device 1 may include not only portable electronic devices such as mobile phones, smart phones, tablet PCs (personal computers), electronic watches, smart watches, watch phones, mobile communication terminals, electronic notebooks, e-books, PMPs (portable multimedia players), navigation devices, game consoles and digital cameras that provide a display screen, but also televisions, laptops, monitors, billboards, Internet of Things, and vehicle display devices that provide a display screen. A type of the display device 1 to which a technical idea of the present disclosure may be applied is not limited thereto.

The display device 1 includes an active area AAR and a non-active area NAR. A portion of the display device 1 displaying an image is defined as a display area, while a portion thereof not displaying the image is defined as a non-display area. An area of the display device 1 in which a touch input is detected is defined as a touch area. The display area and the touch area may belong to the active area AAR. The display area and the touch area may overlap each other. That is, the active area AAR may refer to an area in which the display is performed and the touch input is detected.

The active area AAR may include a circular shape in a plan view. However, the present disclosure is not limited thereto. The active area AAR may have a rectangular shape or a rectangular shape with rounded corners, or may have various shapes such as a square, other polygons or an oval in a plan view.

The non-active area NAR may be disposed around the active area AAR. The non-active area NAR may be a bezel area. The non-active area NAR may completely surround the active area AAR. However, the present disclosure is not limited thereto. For example, the non-active area NAR may not surround at least a partial area of the active area AAR.

In the non-active area NAR, a signal line or driver circuits for applying a signal to the active area AAR (display area or touch area) may be disposed. The non-active area NAR may not include the display area. Furthermore, the non-active area NAR may not include the touch area. In another embodiment, the non-active area NAR may include a partial area of the touch area, and a sensor such as a pressure sensor may be disposed in the partial area. In some embodiments, the active area AAR may be totally identical with the display area in which a screen is displayed and the non-active area NAR may be totally identical with the non-display area in which a screen is not displayed.

The display device 1 includes a display panel 10 that provides a display screen. Examples of the display panel 10 may include an organic light-emitting display panel, a micro LED display panel, a nano LED display panel, a quantum dot light-emitting display panel, a liquid crystal display panel, a plasma display panel, a field emission display panel, an electrophoretic display panel, an electrical wetting display panel, etc. Hereinafter, one example in which the display panel 10 is embodied as an organic light-emitting display panel is described. The present disclosure is not limited thereto. The technical idea of the present disclosure may be applicable to other display panels.

The display panel 10 may include a plurality of pixels. The plurality of pixels may be arranged in a matrix form. A shape of each pixel may be rectangular or square in a plan view. However, the disclosure may not be limited thereto. The shape may be a rhombus shape having each side being inclined with respect to the second direction DR2 or the first direction DR1. Each pixel may include a light-emitting area. Each light-emitting area may have the same shape as that of the pixel, or may have a different shape from that of the pixel. For example, when the shape of the pixel is a rectangular shape, the shape of the light-emitting area of the corresponding pixel may have various shapes such as rectangular, rhombus, hexagonal, octagonal, and circular shapes. A detailed description of each pixel and the light-emitting area will be described later.

The display device 1 may further include a touch sensor that detects a touch input. The touch sensor may be embodied as a touch layer TSL (refer to FIG. 5) formed on a top face of the display panel 10. In this case, the touch layer TSL (see FIG. 5) may be formed integrally with the display panel 10. However, the present disclosure is not limited thereto. The touch sensor may be provided as a separate panel or film from the display panel 10 and then may be attached to the display panel 10. A following embodiment exemplifies a case where the touch sensor is provided in a form of the touch layer TSL (see FIG. 5). The present disclosure is not limited thereto.

The display panel 10 may include a flexible substrate including a flexible polymer material such as polyimide. Accordingly, the display panel 10 may be bendable, foldable, or rollable.

The display panel 10 may include a bending area BA where a portion the display panel is bendable. The display panel 10 may include the bending area BA, a main area MA located on one side in the second direction DR2 of the bending area BA, and a sub-area SA disposed on an opposite side of the main area MA with respect to the bending area BA along the second direction DR2. The display area of the display panel 10 may be disposed within the main area MA. In one embodiment, an outer edge area around the display area in the main area MA, an entirety of the bending area BA, and an entirety of the sub-area SA may constitute the non-display area. However, the disclosure is not limited thereto. Each of the bending area BA and/or the sub-area SA may have a display area.

The main area MA may have a planar shape generally similar to a planar shape of the display device 1. The main area MA may be flat and may be disposed on one plane. However, the present disclosure is not limited thereto. At least a portion of a remaining edge portion of the main area MA except for edge portion connected to the bending area BA may be bent to form a curved surface or may be bent in a vertical direction.

When at least a portion of a remaining edge portion of the main area MA except for an edge portion connected to the bending area BA is bent to form a curved surface or is bent in a vertical direction, a display area may be disposed in the at least a portion. The present disclosure is not limited thereto. The curved or bent edge portion may act as a non-display area that does not display a screen. Alternatively, a combination of a display area and a non-display area may be disposed in the curved or bent edge portion.

The bending area BA may be connected to the opposite side of the main area MA in the second direction DR2. For example, the bending area BA may be connected to a lower short-side of the main area MA. A width of the bending area BA in the first direction DR1 may be smaller than a width of the main area MA in the first direction DR1 disposed adjacent to the bending area BA.

In the bending area BA, the display panel 10 may be bent for the sub-area SA to overlap the main area MA in a plan view thereby a bottom surface of the main area MA and a bottom surface of the sub-area SA may face each other. The bending area BA may have a certain radius of curvature. The present disclosure is not limited thereto. The bending area BA may have different radius of curvatures in different portions of the bending area BA. As the display panel 10 is bent in the bending area BA, a face of the display panel 10 in the sub-area SA may turn upside down. That is, one face of the display panel 10 may face upwards, then may face laterally, and then may face downwards.

The sub-area SA extends from the bending area BA. When the bending has been completed, the sub-area SA may extend in a direction parallel to a plane of the main area MA. The sub-area SA may overlap the main area MA in the thickness direction of the display panel 10. A width of the sub-area SA in the first direction DR1 may increase as the sub-area SA extends in a direction away from the bending area BA. However, the present disclosure is not limited thereto.

A driver chip 20 may be disposed in the sub-area SA. The driver chip 20 may include an integrated circuit that drives the display panel 10. The integrated circuit may include an integrated circuit for displaying an image and/or an integrated circuit for a touch sensor. However, the present disclosure is not limited thereto. The integrated circuit for displaying an image and the integrated circuit for the touch sensor may be provided as separate chips, or may be integrated into one chip.

A pad area may be disposed in an end of the sub-area SA of the display panel 10. The pad area may include a plurality of display signal line pads and a plurality of touch signal line pads. A driver board 30 may be connected to the pad area in the end of the sub-area SA of the display panel 10. The driver board 30 may be embodied as a flexible printed circuit board or film.

Figure 3:
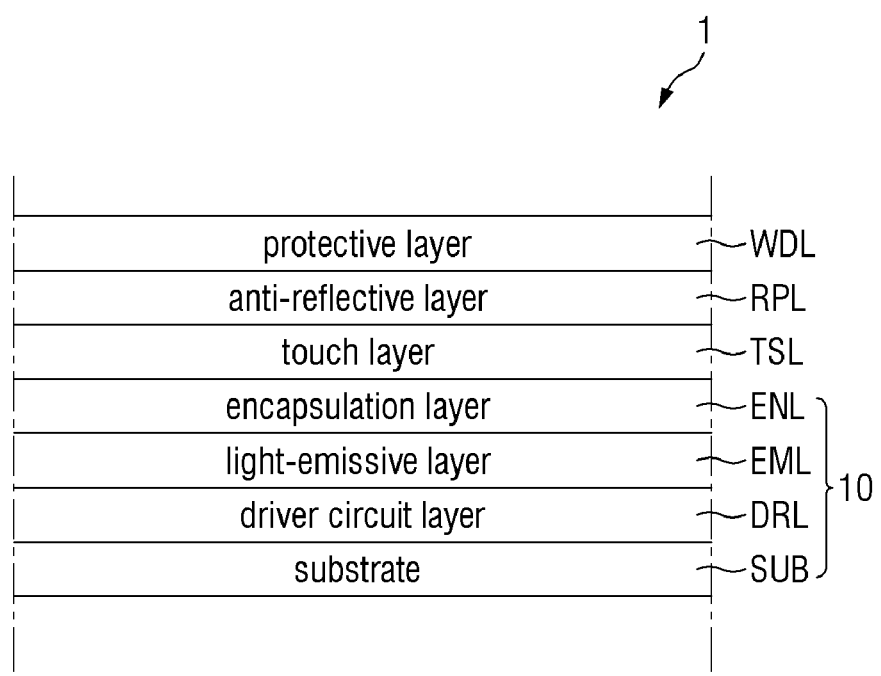
FIG. 3 is a schematic cross-sectional view showing a stack structure of a display panel according to one embodiment.

FIG. 3 is a schematic cross-sectional view showing a stack structure of a display panel according to one embodiment.

Referring to FIG. 3, the display device 1 may include a substrate SUB, a driver circuit layer DRL, a light-emissive layer EML, an encapsulation layer ENL, a touch layer TSL, an anti-reflective layer RPL and a protective layer WDL which are sequentially stacked vertically. The display panel 10 may include the substrate SUB, the driver circuit layer DRL, the light-emissive layer EML and the encapsulation layer ENL.

The substrate SUB may support the components disposed thereon.

The driver circuit layer DRL may be disposed on a top face of the substrate SUB. The driver circuit layer DRL may include a circuit that drives the light-emissive layer EML of the pixel. The driver circuit layer DRL may include a plurality of thin-film transistors.

The light-emissive layer EML may be disposed on a top face of the driver circuit layer DRL. The light-emissive layer EML may include an organic light-emissive layer. The light-emissive layer EML may emit light at various luminance levels based on a driving signal transmitted from the driver circuit layer DRL.

The encapsulation layer ENL may be disposed on a top face of the light-emissive layer EML. The encapsulation layer ENL may include an inorganic layer or a stack of an inorganic layer and an organic layer. In another example, the encapsulation layer ENL may be made of glass or may be embodied as an encapsulation film.

The touch layer TSL may be disposed on a top face of the encapsulation layer ENL. The touch layer TSL may recognize a touch input and may perform a function of a touch sensor. The touch layer TSL may include a plurality of sensing areas and a plurality of sensing electrodes.

The anti-reflective layer RPL may be disposed on a top face of the touch layer TSL. The anti-reflective layer RPL may serve to reduce external light reflection. The anti-reflective layer RPL may be embodied as a polarizing layer attached to the touch layer TSL. In this case, the anti-reflective layer RPL may polarize light passing therethrough. The anti-reflective layer RPL may be attached to the touch layer TSL via an adhesive layer. The anti-reflective layer RPL may be omitted. The anti-reflective layer RPL may serve to reduce external light reflection.

However, the present disclosure is not limited thereto. The anti-reflective layer RPL may be embodied as a color filter layer disposed on the touch layer TSL. In this case, the anti-reflective layer RPL may include a color filter that selectively transmits light of a specific wavelength, and the like therethrough.

The protective layer WDL may be disposed on a top surface of the anti-reflection layer RPL. The protective layer WDL may include, for example, a window member. The protective layer WDL may be attached to the anti-reflective layer RPL via an optically clear adhesive or the like.

Figure 4:
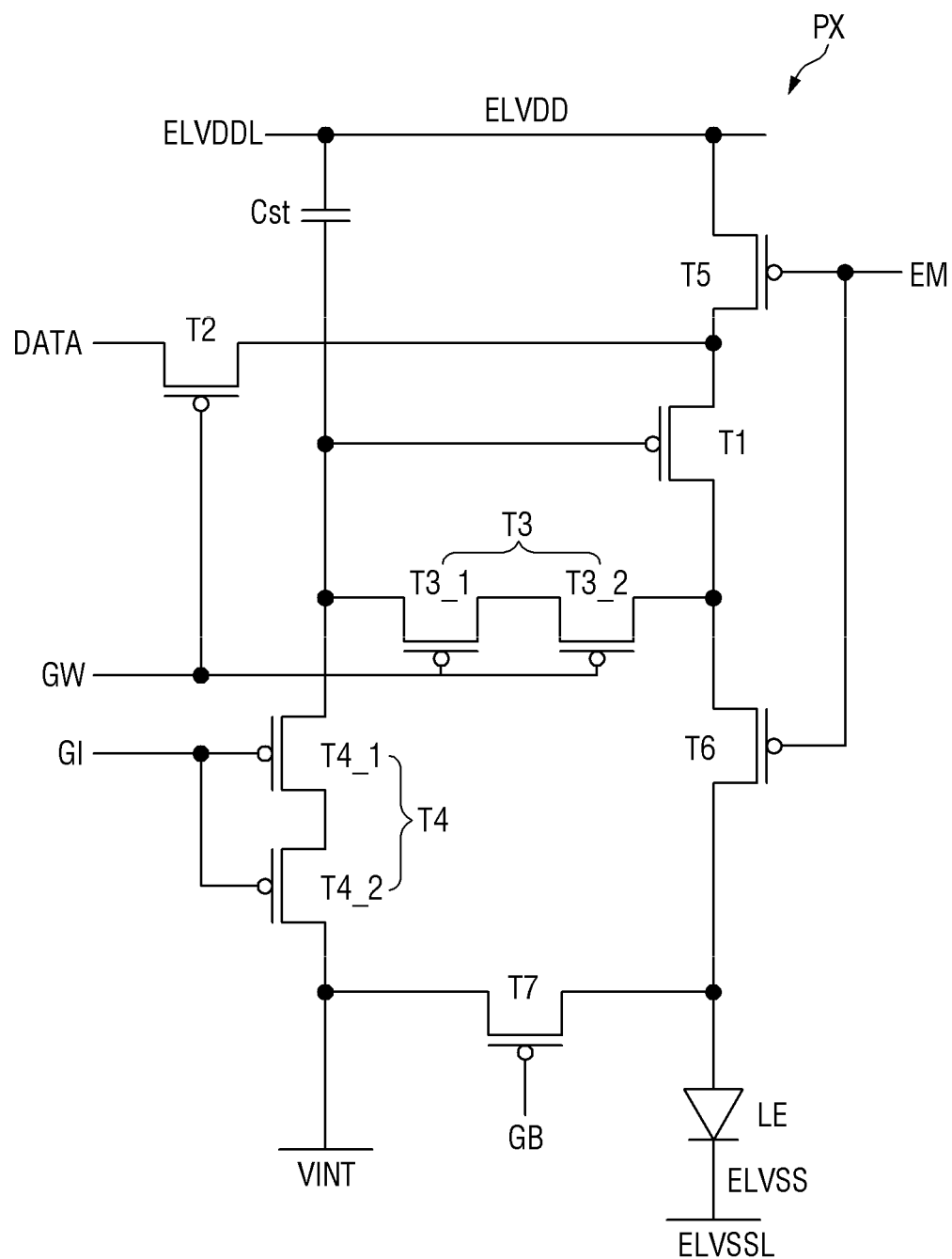
FIG. 4 is a detailed circuit diagram showing one pixel according to one embodiment.

FIG. 4 is a detailed circuit diagram showing one pixel according to one embodiment.

Referring to FIG. 4, a circuit of a pixel PX includes a plurality of transistors T1 to T7, a capacitor Cst, and a light-emissive element LE, and the like. A data signal DATA, a first scan signal GW, a second scan signal GI, a third scan signal GB, a light-emission control signal EM, a first power voltage ELVDD, a second power voltage ELVSS, and an initialization voltage VINT are applied to a circuit of one pixel PX.

Figure 5:
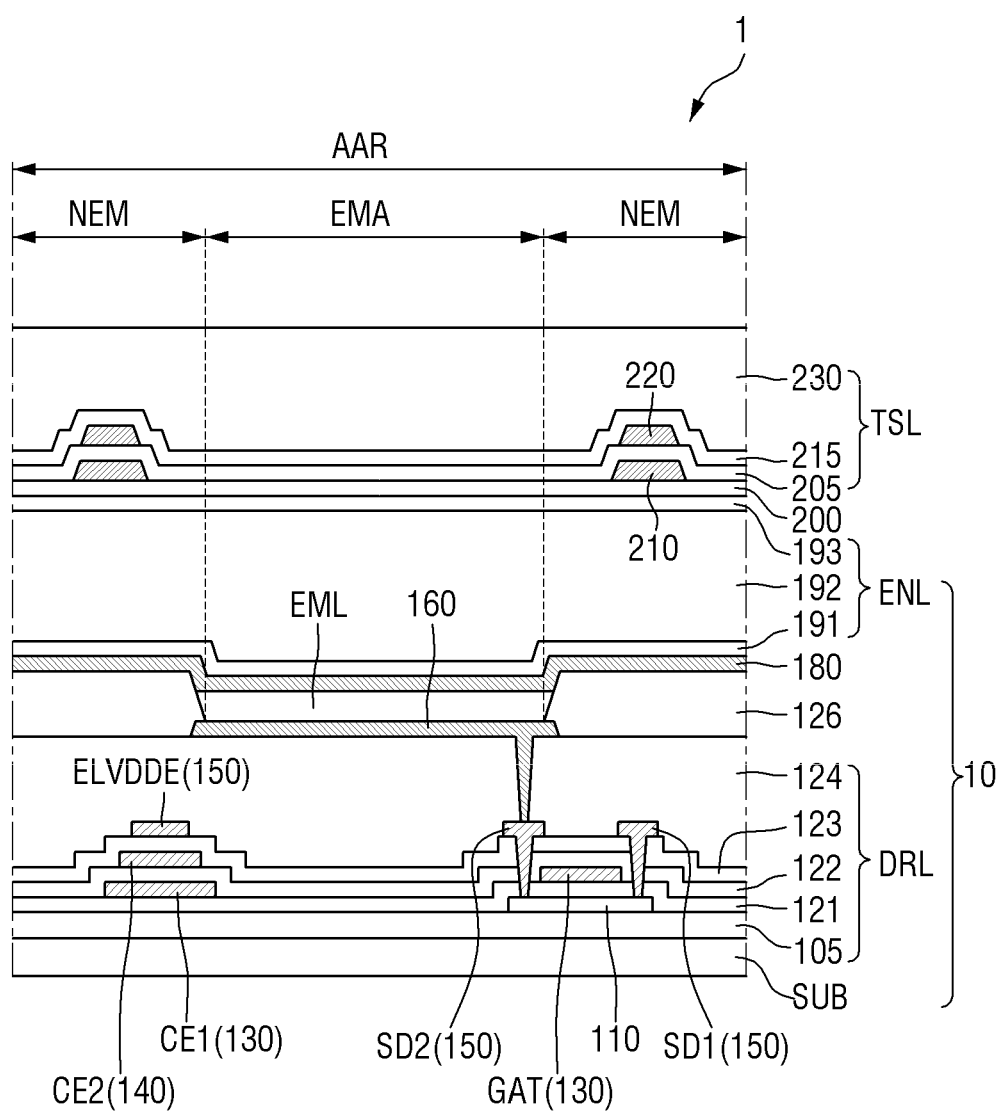
FIG. 5 is a cross-sectional view of one pixel and a portion therearound a display device according to one embodiment.

The light-emissive element LE may be an organic light-emissive diode which include a first electrode (or anode) (see '160' in FIG. 5), a light-emissive layer (see 'EML' in FIG. 5), and a second electrode (or cathode) (see '180' in FIG. 5). However, the present disclosure is not limited thereto. The light-emissive element LE may be an inorganic light-emissive diode including a first electrode, an inorganic light-emissive layer, and a second electrode.

The plurality of transistors may include first to seventh transistors T1 to T7. Each of the transistors T1 to T7 includes a gate electrode, a first electrode (or first source/drain electrode) and a second electrode (or second source/drain electrode). One of the first and second electrodes of each of the transistors T1 to T7 may act as a source electrode while the other thereof may act as a drain electrode.

The first transistor T1 may serve as a driving transistor, while each of the second to seventh transistor T2 to T7 may serve as a switching transistor. Each of the transistors T1 to T7 includes a gate electrode, a first electrode and a second electrode. One of the first and second electrodes of each of the transistors T1 to T7 may act as a source electrode while the other thereof may act as a drain electrode.

Each of the transistors T1 to T7 may be embodied as a thin-film transistor. Each of the transistors T1 to T7 may be embodied as one of a PMOS transistor and an NMOS transistor. In one embodiment, the first transistor T1 may act as a driving transistor, the second transistor T2 may act as a data transfer transistor, the third transistor T3 may act as a compensation transistor, the fourth transistor T4 may act as a first initialization transistor, the fifth transistor T5 may act as a first light-emission control transistor, the sixth transistor T6 may act as a second light-emission control transistor, and the seventh transistor T7 may act as a second initialization transistor. In this case, all of the transistors T1 to T7 may be embodied as the PMOS transistor.

However, the present disclosure is not limited thereto. In one example, each of the third transistor T3 acting as a compensation transistor and the fourth transistor T4 acting as a first initialization transistor may be embodied as a NMOS transistor. Each of the first transistor T1 acting as a driving transistor, the second transistor T2 acting as a data transfer transistor, the fifth transistor T5 acting as a first emission control transistor, the sixth transistor T6 acting as a second light-emission control transistor, and the seventh transistor T7 acting as a second initialization transistor may be embodied as a PMOS transistor.

In this case, an active layer of each of the third transistor T3 and the fourth transistor T4 may be made of a material different from a material of an active layer of each of the first transistor T1, the second transistor T2, the fifth transistor T5, the sixth transistor T6, and the seventh transistor T7. The present disclosure is not limited thereto. In one example, the active layer of each of the third transistor T3 and the fourth transistor T4 may include an oxide semiconductor, while the active layer of each of the first transistor T1, the second transistor T2, the fifth transistor T5, the sixth transistor T6, and the seventh transistor T7 may include polycrystalline silicon.

Hereinafter, each of the components will be described in detail.

A gate electrode of the first transistor T1 may be connected to a first electrode of the capacitor Cst. A first electrode of the first transistor T1 may be connected to a first power voltage line ELVDDL via the fifth transistor T5. A second electrode of the first transistor T1 may be connected to an anode of the light-emissive element LE via the sixth transistor T6. The first transistor T1 receives the data signal DATA in response to a switching operation of the second transistor T2 and thus supplies a drive current to the light-emissive element LE.

A gate electrode of the second transistor T2 may be connected to a first scan signal GW line. A first electrode of the second transistor T2 may be connected to a data signal DATA line. A second electrode of the second transistor T2 may be connected to the first electrode of the first transistor T1 and may be connected to the first power voltage line ELVDDL via the fifth transistor T5. The second transistor T2 may be turned on in response to a first scan signal GW to transfer the data signal DATA to the first electrode of the first transistor T1.

The third transistor T3 may be embodied as a dual transistor including a first sub-transistor T3_1 and a second sub-transistor T3_2 serially connected each other. A gate electrode of the first sub-transistor T3_1 may be connected to the first scan signal GW line, a first electrode thereof may be connected to a second electrode of the second sub-transistor T3_2, and a second electrode thereof may be connected to the first electrode of the capacitor Cst, a first electrode of a third sub-transistor T4_1, and the gate electrode of the first transistor T1. A gate electrode of the second sub-transistor T3_2 may be connected to the first scan signal GW line, a first electrode thereof may be connected to the second electrode of the first transistor T1, and a second electrode thereof may be connected to the first electrode of the first sub-transistor T3_1.

The first sub-transistor T3_1 and the second sub-transistor T3_2 may be turned on in response to the first scan signal GW to connect the gate electrode and the second electrode of the first transistor T1 to each other to allow the first transistor T1 to act as a diode. Thus, voltage a difference corresponding to a threshold voltage of the first transistor T1 may occur between voltages of the first electrode and the gate electrode of the first transistor T1. The data signal DATA compensated for the threshold voltage may be supplied to the gate electrode of the first transistor T1, thereby compensating for the threshold voltage difference of the first transistor T1.

The fourth transistor T4 may be embodied as a dual transistor including the third sub-transistor T4_1 and a fourth sub-transistor T4_2 serially connected each other. A gate electrode of the third sub-transistor T4_1 may be connected to a second scan signal GI line, a first electrode thereof may be connected to the first electrode of the capacitor Cst, the second electrode of the first sub-transistor T3_1, and the gate electrode of the first transistor T1, and a second electrode thereof may be connected to a first electrode of the fourth sub-transistor T4_2. A gate electrode of the fourth sub-transistor T4_2 may be connected to the second scan signal GI line, the first electrode thereof may be connected to the second electrode of the third sub-transistor T4_1, and a second electrode thereof may be connected to an initialization voltage VINT line. The third sub-transistor T4_1 and the fourth sub-transistor T4_2 may be turned on in response to a second scan signal GI to transmit the initialization voltage VINT to the gate electrode of the first transistor T1 to initialize a voltage of the gate electrode of the first transistor T1.

A gate electrode of the fifth transistor T5 may be connected to a light-emission control signal EM line, a first electrode thereof may be connected to the first power voltage line ELVDDL, and a second electrode thereof may be connected to the first electrode of the first transistor T1. The fifth transistor T5 may be turned on in response to a light-emission control signal EM to connect the first electrode of the first transistor T1 to the first power voltage line ELVDDL.

The sixth transistor T6 may be connected between the second electrode of the first transistor T1 and the first electrode of the light-emissive element LE. A gate electrode of the sixth transistor T6 may be connected to the light-emission control signal EM line, a first electrode thereof may be connected to the second electrode of the first transistor T1 and the first electrode of the second sub-transistor T3_2, and a second electrode thereof may be connected to the first electrode of the light-emissive element LE.

The fifth transistor T5 and the sixth transistor T6 may be simultaneously turned on in response to the light-emission control signal EM, such that a drive current flows through the light-emissive element LE.

A gate electrode of the seventh transistor T7 may be connected to a third scan signal GB line. A first electrode of the seventh transistor T7 may be connected to the anode of the light-emissive element LE. A second electrode of the seventh transistor T7 may be connected to an initialization voltage VINT line. The seventh transistor T7 may be turned on in response to a third scan signal GB to initialize a voltage of the anode of the organic light-emissive element OLED.

In this embodiment, a case where the gate electrode of the seventh transistor T7 receives the third scan signal GB is exemplified. In another embodiment, the circuit of the pixel PX may be configured so that the gate electrode of the seventh transistor T7 receives the second scan signal GI. In still another embodiment, the circuit of the pixel may be configured so that the first scan signal GW is applied to the gate electrode of the seventh transistor T7.

The capacitor Cst may be connected between the gate electrode of the first transistor T1 and the first power voltage line ELVDDL, and may include the first electrode and a second electrode. The first electrode of the capacitor Cst may be connected to the gate electrode of the first transistor T1, the second electrode of the third transistor T3, and the first electrode of the fourth transistor T4, while the second electrode of capacitor Cst may be connected to the first power voltage line ELVDDL. The capacitor Cst may play a role of maintaining the data voltage applied to the gate electrode of the first transistor T1 at a constant level.

The cathode of the light-emissive element LE may be connected to the second power voltage line ELVSSL, and may receive the second power voltage ELVSS from the second power voltage line ELVSSL. The light-emissive element LE receives the drive current from the first transistor T1 and thus emits light to display the image.

Hereinafter, a cross-sectional structure of the aforementioned pixel PX will be described in detail.

FIG. 5 is a cross-sectional view of one pixel and a portion of a display device surrounding the one pixel according to one embodiment. FIG. 5 shows a cross-sectional view of the display panel 10 and the touch layer TSL.

Referring to FIG. 5, the display device 1 may include the substrate SUB, the driver circuit layer DRL, an anode 160 disposed on the driver circuit layer DRL, a pixel defining layer 126 including an opening exposing the anode 160, the light-emissive layer EML disposed within the opening of the pixel defining layer 126, a cathode 180 disposed on the light-emissive layer EML and the pixel defining layer 126, the encapsulation layer ENL disposed on the cathode 180, and the touch layer TSL disposed on the encapsulation layer ENL. Each of the above-described layers may include a single film, or may include a stack of a plurality of films. Another layer may be further disposed between the above-described layers.

The driver circuit layer DRL may include a buffer layer 105, a semiconductor layer 110, a first insulating layer 121, a first conductive layer 130, a second insulating layer 122, a second conductive layer 140, a third insulating layer 123, a third conductive layer 150, and a fourth insulating layer 124.

The substrate SUB may support the layers disposed thereon. The substrate SUB may be made of an insulating material such as a polymer resin or an inorganic material such as glass or quartz. The substrate SUB may be a flexible substrate, and thus may be bendable, foldable or rollable. However, the present disclosure is not limited thereto.

The buffer layer 105 may be disposed on the substrate SUB. The buffer layer 105 may include silicon nitride, silicon oxide, or silicon oxynitride.

The semiconductor layer 110 may be disposed on the buffer layer 105. The semiconductor layer 110 may act as a channel of the thin-film transistor of the pixel.

The first insulating layer 121 may be disposed on the semiconductor layer 110. The first insulating layer 121 may be embodied as a first gate insulating layer having a gate insulating function.

The first conductive layer 130 may be disposed on the first insulating layer 121. The first conductive layer 130 may include a gate electrode GAT of the thin-film transistor of the pixel PX, a scan line connected thereto, and a first electrode CE1 of the capacitor Cst.

The second insulating layer 122 may be disposed on the first conductive layer 130. The second insulating layer 122 may act as an interlayer insulating layer or a second gate insulating layer.

The second conductive layer 140 may be disposed on the second insulating layer 122. The second conductive layer 140 may include a second electrode CE2 of the capacitor Cst.

The third insulating layer 123 may be disposed on the second conductive layer 140. The third insulating layer 123 may act as an interlayer insulating layer.

The third conductive layer 150 may be disposed on the third insulating layer 123. The third conductive layer 150 may include a first electrode SD1 and a second electrode SD2 of the thin-film transistor of the pixel, and a data line connected thereto. The first electrode SD1 and the second electrode SD2 of the thin-film transistor may be electrically connected to a source area and a drain area of the semiconductor layer 110 respectively via first and second contact holes extending through the third insulating layer 123, the second insulating layer 122, and the first insulating layer 121.

The fourth insulating layer 124 may be disposed on the third conductive layer 150. The fourth insulating layer 124 covers the third conductive layer 150. The fourth insulating layer 124 may act as a planarization layer. The fourth insulating layer 124 may include an organic insulating layer. In this case, a top face of the fourth insulating layer 124 may be substantially planarized while a bottom face thereof has a step.

The anode 160 may be disposed on the fourth insulating layer 124. The anode 160 may act as a pixel electrode for each pixel. The anode 160 may be connected to the second electrode SD2 of the thin-film transistor via a contact hole extending through the fourth insulating layer 124. The anode 160 may at least partially overlap the light-emitting area EMA.

The anode 160 may have a stack structure in which a layer made of a material having a higher work function such as indium-tin-oxide (ITO), indium-zinc-oxide (IZO), zinc oxide (ZnO), indium oxide (In$_2$O$_3$), and a reflective material layer made of silver (Ag), magnesium (Mg), aluminum (Al), platinum (Pt), lead (Pb), palladium (Pd), gold (Au), nickel (Ni), neodymium (Nd), iridium (Ir), chromium (Cr), lithium (Li), calcium (Ca) or mixtures thereof are stacked one on top of the other. However, the present disclosure is not limited thereto. In one example, the layer having the higher work function may be disposed on a top face of the reflective material layer and may be closer to the light-emitting layer EML. The anode 160 may have a multilayer structure of ITO/Mg, ITO/MgF, ITO/Ag, and ITO/Ag/ITO. However, the present disclosure is not limited thereto.

The pixel defining layer 126 may be disposed on the anode 160. The pixel defining layer 126 may be disposed on the anode 160 and may include the opening defined therein exposing the anode 160. The light-emitting area EMA and the non-light emitting area NEM may be distinguished from each other via the pixel defining layer 126 and the opening defined therein.

The light-emissive layer EML may be disposed on the anode 160 exposed through the opening of the pixel defining layer 126. The light-emissive layer EML may include an organic material layer. The organic material layer of the light-emissive layer may include an organic light-emissive layer, and may further include a hole injection/transport layer and/or an electron injection/transport layer.

The cathode 180 may be disposed on the light-emissive layer EML. The cathode 180 may act as a common electrode extending across all of the pixels. The anode 160, the light-emissive layer EML and the cathode 180 may constitute an organic light-emissive element.

The cathode 180 may include a layer made of a material having a lower work function, such as Li, Ca, LiF/Ca, LiF/Al, Al, Mg, Ag, Pt, Pd, Ni, Au Nd, Ir, Cr, BaF, Ba or compounds or mixtures thereof (e.g., a mixture of Ag and Mg). The cathode 180 may further include a transparent metal oxide layer disposed on the material layer having the lower work function.

The encapsulation layer ENL including a first inorganic encapsulation layer 191, an organic encapsulation layer 192, and a second inorganic encapsulation layer 193 may be disposed on the cathode 180. At a distal end of the encapsulation layer ENL, the first inorganic encapsulation layer 191 and the second inorganic encapsulation layer 193 may be in direct contact with each other. The organic encapsulation layer 192 may be sealed with the first inorganic encapsulation layer 191 and the second inorganic encapsulation layer 193.

Each of the first inorganic encapsulation layer 191 and the second inorganic encapsulation layer 193 may include silicon nitride, silicon oxide, or silicon oxynitride. The organic encapsulation layer 192 may include an organic insulating material.

The touch layer TSL may be disposed on the encapsulation layer ENL. The touch layer TSL may include a base layer 200, a first touch conductive layer 210 disposed on the base layer 200, a first touch insulating layer 205 disposed on the first touch conductive layer 210, a second touch conductive layer 220 disposed on the first touch insulating layer 205, and a second touch insulating layer 215 and 230 that covers the second touch conductive layer 220.

Specifically, the first touch conductive layer 210 may be disposed on the base layer 200. The first touch conductive layer 210 is covered with the first touch insulating layer 205. The first touch insulating layer 205 insulates the first touch conductive layer 210 from the second touch conductive layer 220. The second touch conductive layer 220 may be disposed on the first touch insulating layer 205. The second touch insulating layer 215 and 230 may cover and protect the second touch conductive layer 220.

The base layer 200 may include an inorganic insulating material. For example, the base layer 200 may include a silicon nitride layer, a silicon oxynitride layer, a silicon oxide layer, a titanium oxide layer, or an aluminum oxide layer. In some embodiments, the base layer 200 may be omitted. In this case, the first touch conductive layer 210 may be directly disposed on a second inorganic encapsulation layer 193 constituting a thin-film encapsulation layer to be described later.

Each of the first touch conductive layer 210 and the second touch conductive layer 220 may include a metal or a transparent conductive layer. The metal may include aluminum, titanium, copper, molybdenum, silver, or alloys thereof. The transparent conductive layer may include a transparent conductive oxide such as ITO (indium tin oxide), IZO (indium zinc oxide), ZnO (zinc oxide), ITZO (indium tin zinc oxide), or a conductive polymer such as PEDOT, metal nanowire, graphene, or the like. The first touch conductive layer 210 and the second touch conductive layer 220 may be disposed in the non-light emitting area NEM. In this case, even when each of the first touch conductive layer 210 and the second touch conductive layer 220 is made of a low-resistance non-transparent metal, propagation of light emitting from the light emissive layer EML may not be hindered by each of the first touch conductive layer 210 and the second touch conductive layer 220.

Each of the first touch conductive layer 210 and/or the second touch conductive layer 220 may include a conductive layer having a multi-layer structure. For example, each of the first touch conductive layer 210 and/or the second touch conductive layer 220 may have a three-layer structure of titanium/aluminum/titanium.

Each of the first touch insulating layer 205 and the second touch insulating layer 215 and 230 may include an inorganic material or an organic material. In one embodiment, the first touch insulating layer 205 may include an inorganic material, while the second touch insulating layer 215 and 230 may include an organic material. For example, the first touch insulating layer 205 may include a silicon nitride layer, a silicon oxynitride layer, a silicon oxide layer, a titanium oxide layer, or an aluminum oxide layer. The second touch insulating layer 215 and 230 may include an inorganic material 215 and an organic material 230 which include at least one of acrylic resin, methacrylic resin, polyisoprene, vinyl-based resin, epoxy-based resin, urethane-based resin, cellulose-based resin, siloxane-based resin, polyimide-based resin, polyamide-based resin, and perylene-based resin. When the second touch insulating layer 230 includes the organic material, a top face thereof may be generally planarized while a bottom face thereof has a step. The second touch insulating layer 215 may be an optional layer which may be omitted.

Figure 6:
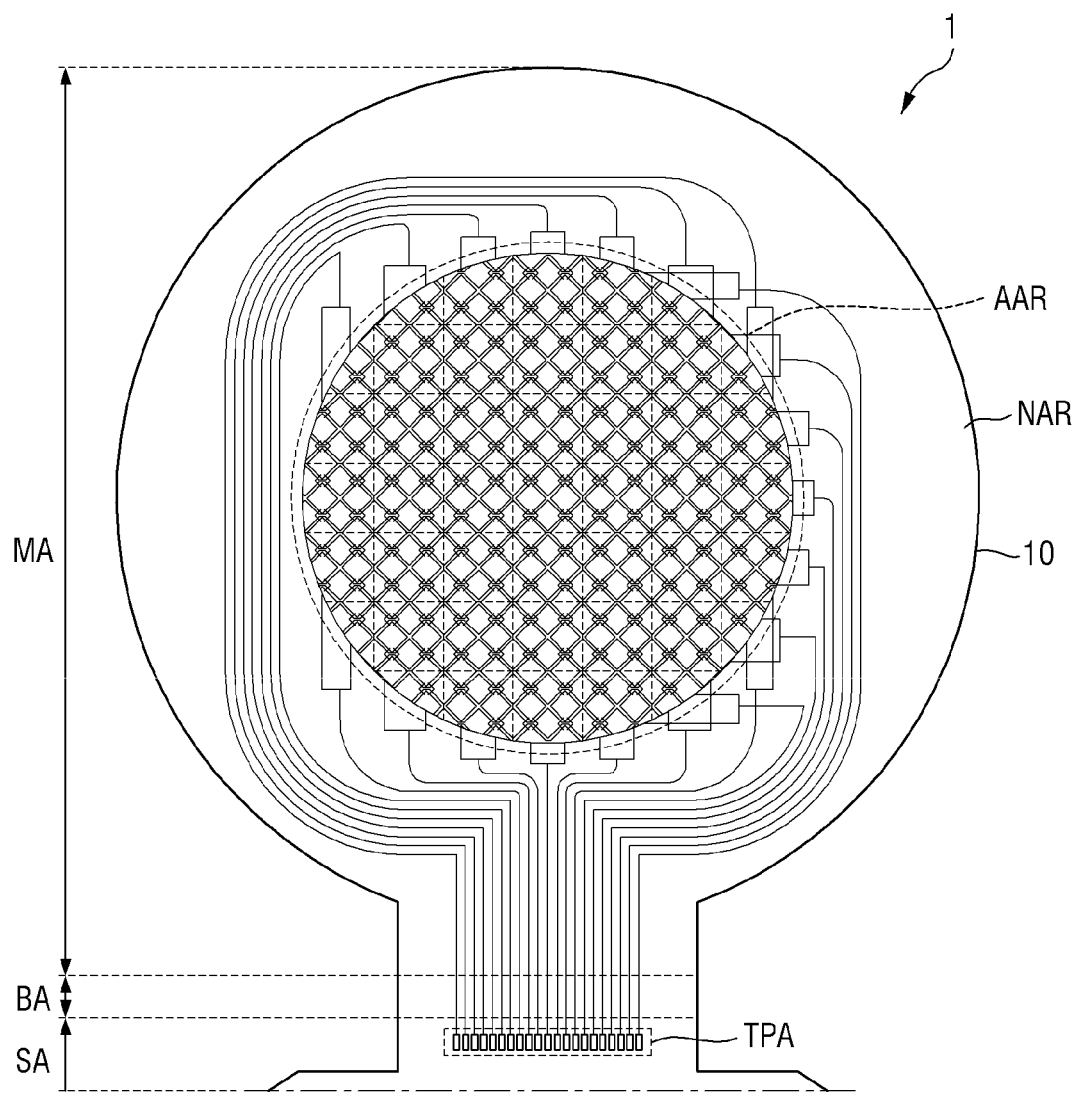
FIG. 6 is a plan view of a display device including a touch sensor according to one embodiment.
Figure 6:
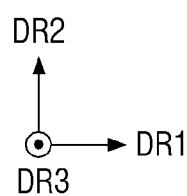
Figure 7:
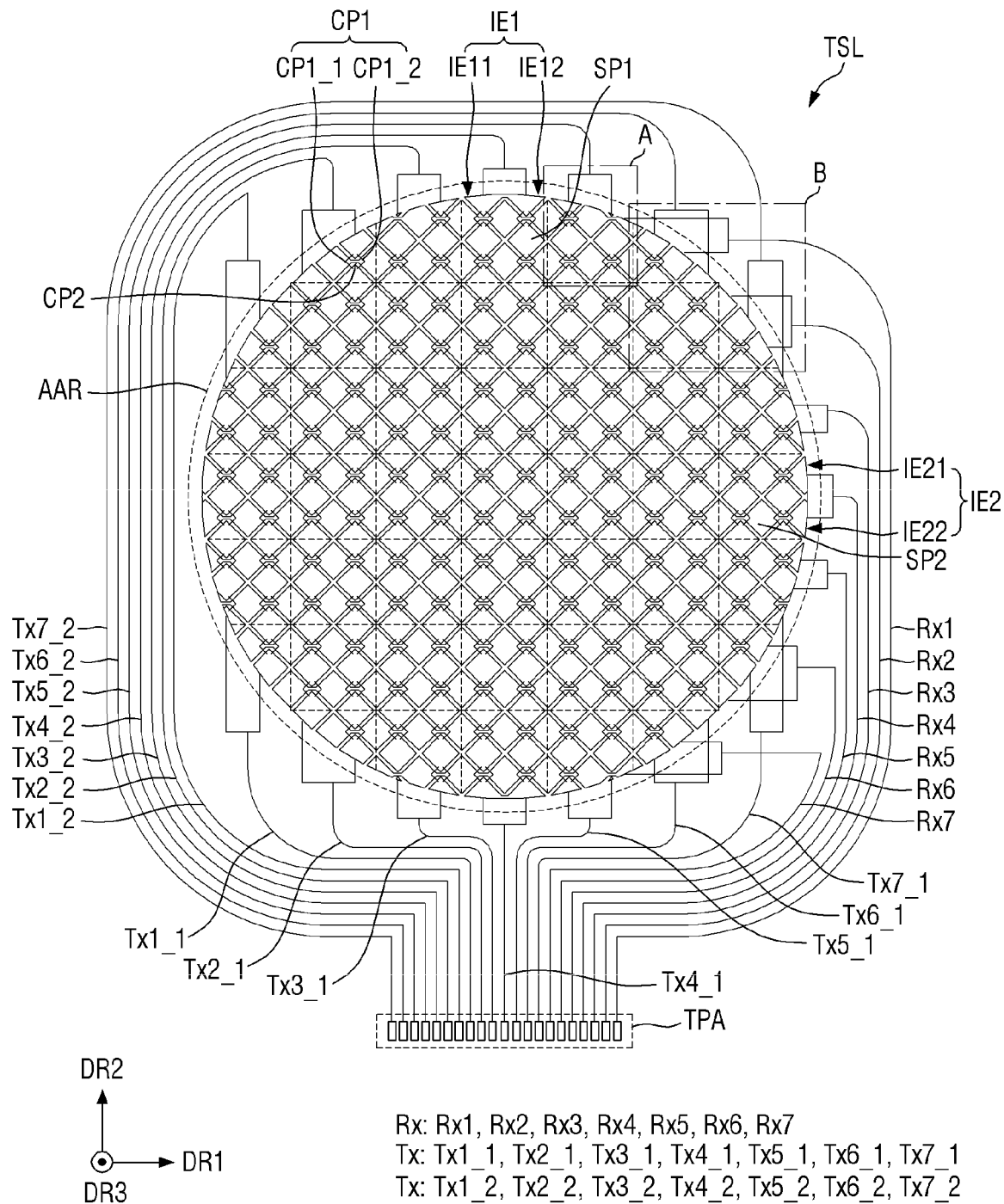
FIG. 7 and FIG. 8 are schematic plan layout views of a touch sensor according to one embodiment.
Figure 8:
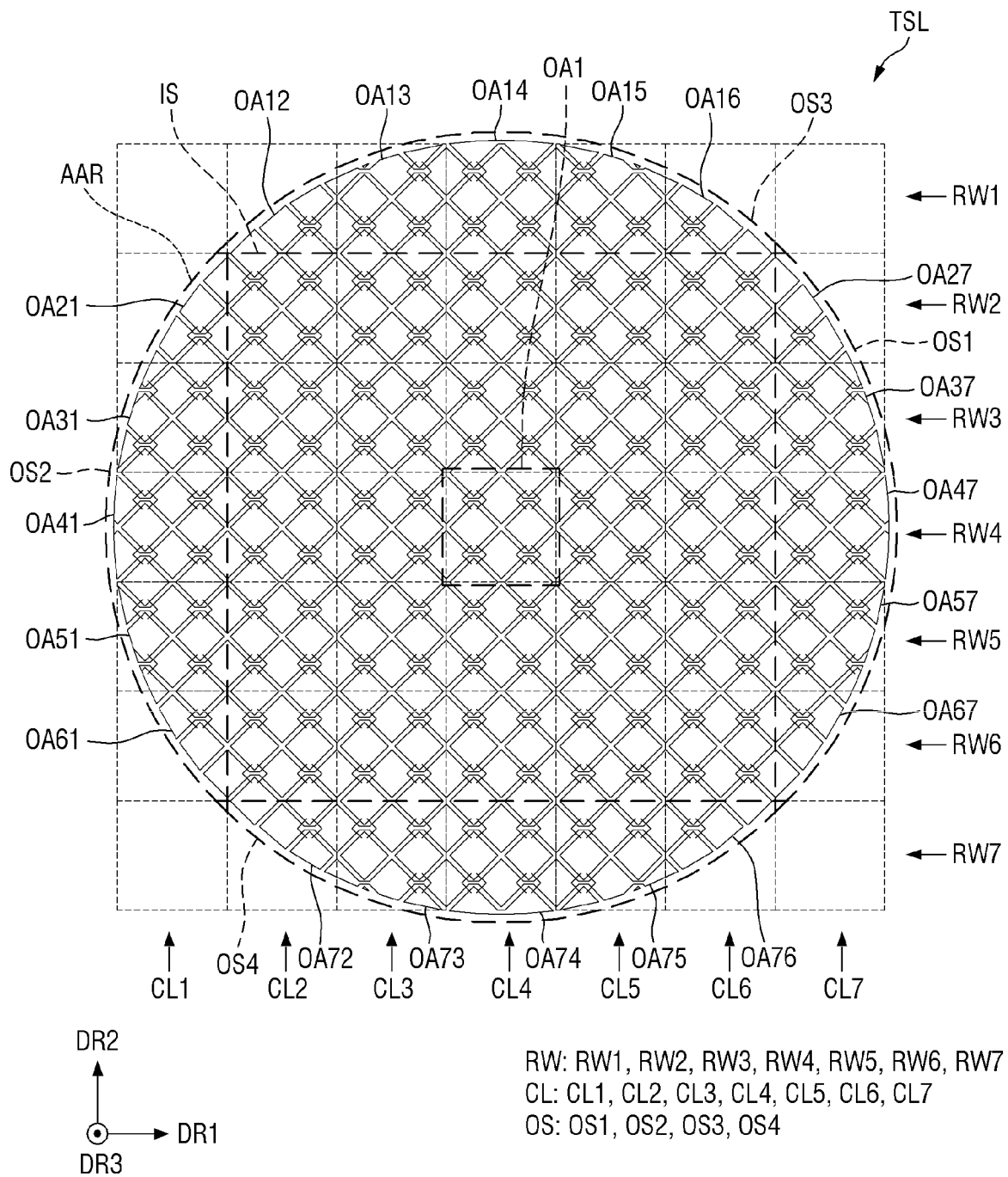
Figure 9:
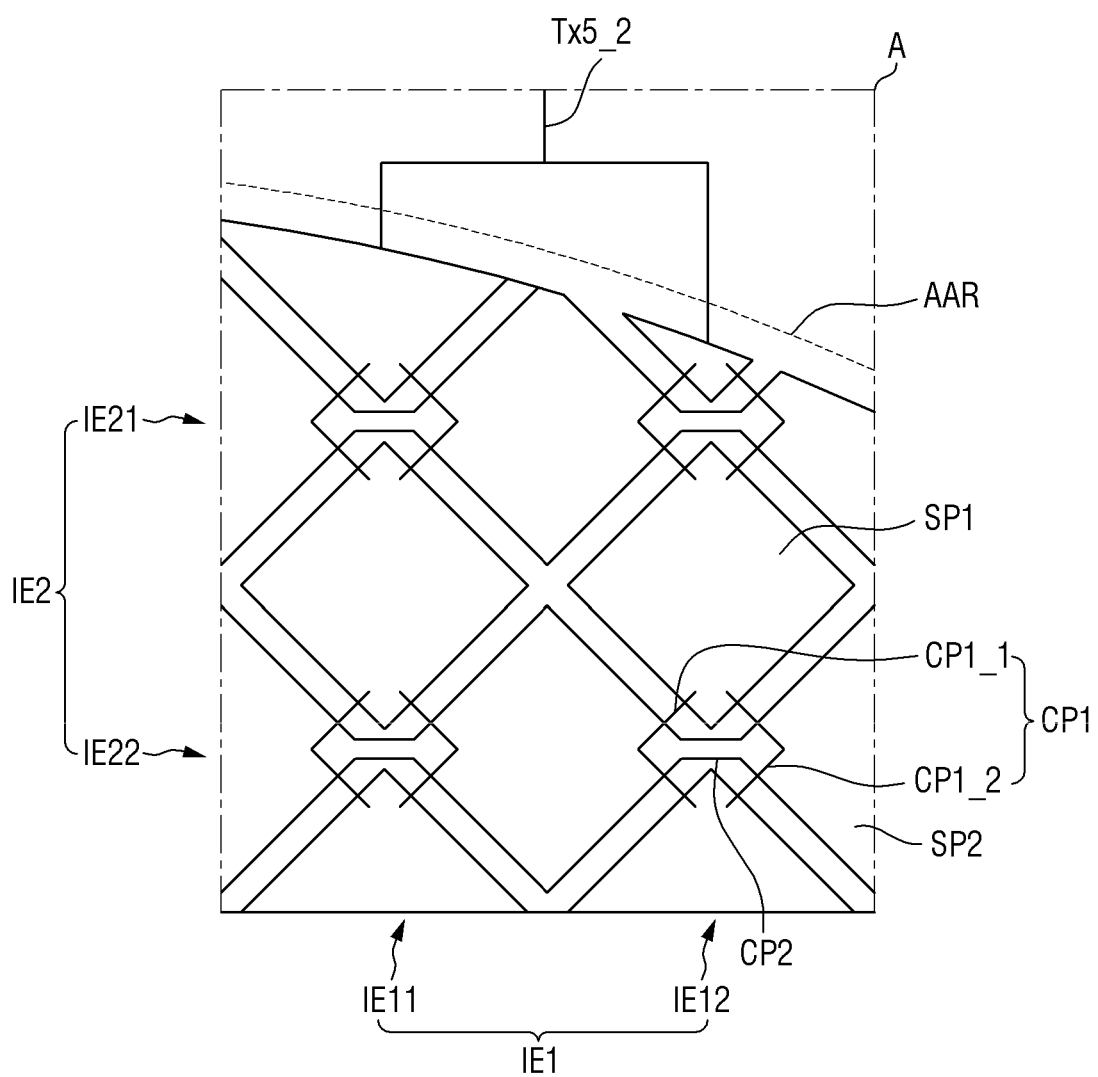
FIG. 9 is an enlarged view of an area A of FIG. 7.
Figure 10:
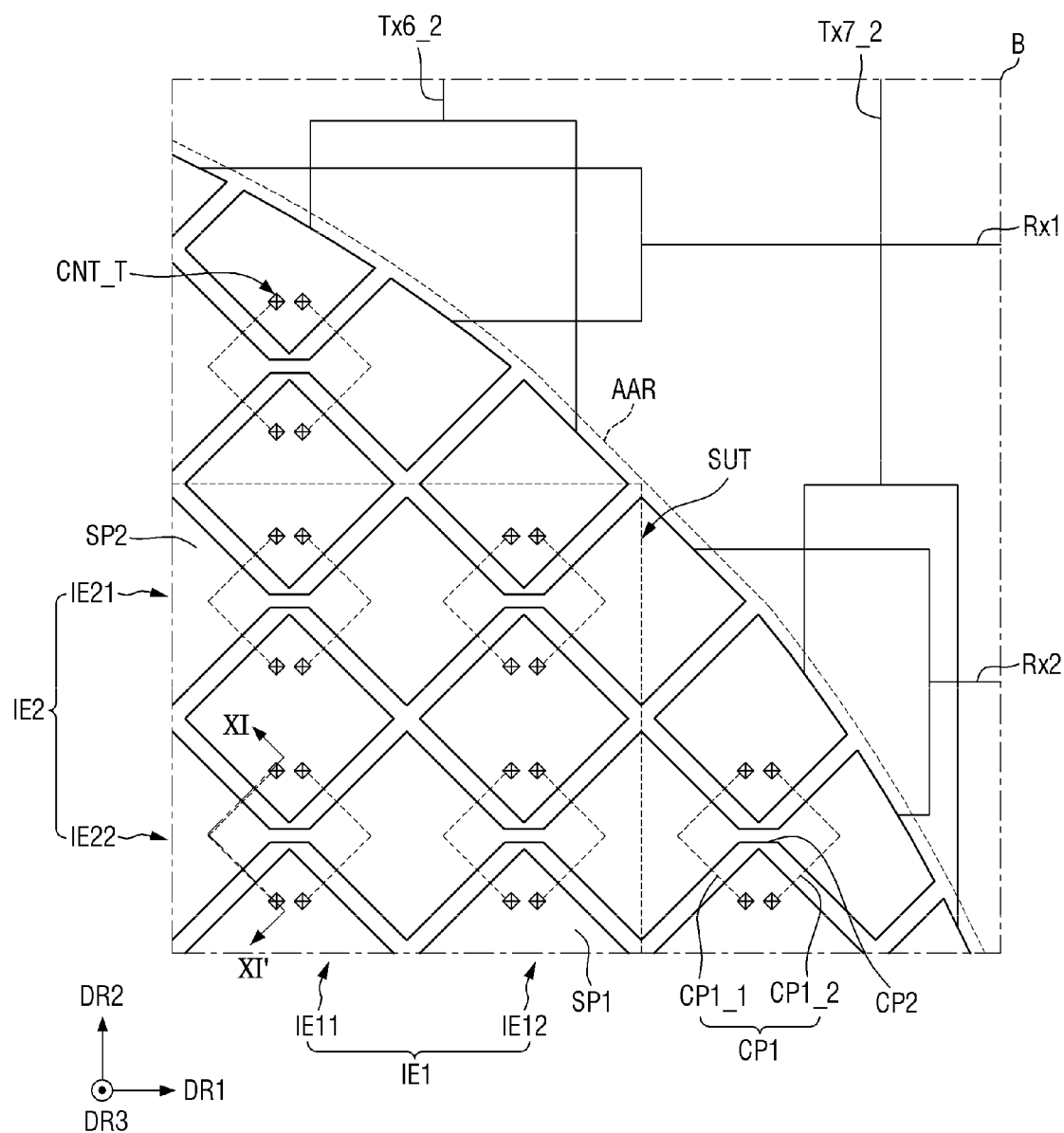
FIG. 10 is an enlarged view of an area B of FIG. 7.

FIG. 6 is a plan view of a display device including a touch sensor according to one embodiment. FIG. 7 and FIG. 8 are schematic plan layout views of the touch sensor according to one embodiment. FIG. 9 is an enlarged view of an area A. FIG. 10 is an enlarged view of an area B. In FIG. 6 to FIG. 8, an overall shape of the touch sensor is simplified for convenience of description. A non-touch area is shown to be relatively wider. However, a shape of the touch area and a shape of the non-touch area may be substantially the same as a shape of the active area AAR and a shape of the non-active area NAR as described above, respectively.

Referring to FIG. 6 to FIG. 10, the touch sensor may include a plurality of first sensing electrodes IE1 (or first touch electrodes) and a plurality of second sensing electrode IE2 (or second touch electrodes) disposed in the touch area. One of the first sensing electrode IE1 and the second sensing electrode IE2 may act as a driving electrode, while the other thereof may act as a sensing electrode. In this embodiment, a case where the first sensing electrode IE1 acts as the driving electrode and the second sensing electrode IE2 acts as the sensing electrode is exemplified.

The first sensing electrode IE1 may extend in the second direction DR2. The first sensing electrode IE1 may include a first sub-sensing electrode IE11 and a second sub-sensing electrode IE12. A plurality of first sub-sensing electrodes IE11 and a plurality of second sub-sensing electrodes IE12 are alternatingly disposed along the first direction DR1. Each of the first sub-sensing electrode IE11 and the second sub-sensing electrode IE12 may extend in the second direction DR2. The first sub-sensing electrode IE11 and the second sub-sensing electrode IE12 may be at least partially spaced apart from each other in the first direction DR1. The first sub-sensing electrode IE11 and the second sub-sensing electrode IE12 at least partially spaced apart from each other may be disposed adjacent to each other in the first direction DR1. In one embodiment, the first sub-sensing electrode IE11 and the second sub-sensing electrode IE12 may be entirely spaced apart from each other.

Each of the plurality of first sensing electrodes IE1 may be electrically connected to each touch driving line Tx. The first sub-sensing electrode IE11 and the second sub-sensing electrode IE12 disposed in one first sensing electrode IE1 and disposed adjacent to each other may be connected to the same touch driving line Tx. In other words, the first sub-sensing electrode IE11 and the second sub-sensing electrode IE12 in one first sensing electrode IE1 may be electrically connected to one touch driving line Tx among a plurality of touch driving lines Tx.

Each of the first sub-sensing electrode IE11 and the second sub-sensing electrode IE12 may include a plurality of first sensor portions SP1 arranged along the second direction DR2, and a first connection portion CP1 for electrically connecting adjacent first sensor portions SP1 to each other. The plurality of first sensing electrodes IE1 may be arranged in the first direction DR1.

The second sensing electrode IE2 may extend in the first direction DR1. The second sensing electrode IE2 may include a third sub-sensing electrode IE21 and a fourth sub-sensing electrode IE22. A plurality of third sub-sensing electrodes IE21 and a plurality of fourth sub-sensing electrodes IE2 are alternatingly disposed along the second direction DR3. Each of the third sub-sensing electrode IE21 and the fourth sub-sensing electrode IE22 may extend in the first direction DR1. The third sub-sensing electrode IE21 and the fourth sub-sensing electrode IE22 may be at least partially spaced apart from each other in the second direction DR2. The third sub-sensing electrode IE21 and the fourth sub-sensing electrode IE22 at least partially spaced apart from each other may be disposed adjacent to each other in the second direction DR2. In one embodiment, the third sub-sensing electrode IE21 and the fourth sub-sensing electrode IE22 may be entirely spaced apart from each other.

Each of the plurality of second sensing electrodes IE2 may be electrically connected to each of touch sensing lines Rx. The third sub-sensing electrode IE21 and the fourth sub-sensing electrode IE22 disposed in one second sensing electrode IE2 and disposed adjacent to each other may be connected to the same touch sensing line Rx. In other words, the third sub-sensing electrode IE21 and the fourth sub-sensing electrode IE22 disposed in one second sensing electrode IE2 and disposed adjacent to each other may be electrically connected to one touch sensing line Rx among a plurality of touch sensing lines Rx.

Each of the third sub-sensing electrode IE21 and the fourth sub-sensing electrode IE22 may include a plurality of second sensor portions SP2 arranged in the first direction DR1 and a second connection portion CP2 for electrically connecting adjacent second sensor portions SP2 to each other. The plurality of second sensing electrodes IE2 may be arranged in the second direction DR2.

Although the drawing exemplifies a case in which seven first sensing electrodes IE1 are arranged and seven second sensing electrodes IE2 are arranged, it is obvious that each of the number of the first sensing electrodes IE1 and the number of the second sensing electrodes IE2 is not limited to the above example.

Each of some of the first sensor portions SP1 and each of some of the second sensor portions SP2 may have a rhombus shape. Each of the other of the first sensor portions SP1 and each of the other of the second sensor portions SP2 may have a rhombus shape in which a part of the rhombus is removed. For example, each of the first sensor portions SP1 except for the first sensor portions SP1 disposed at both opposing ends in an arrangement direction thereof may have the rhombus shape, while each of the first sensor portions SP1 disposed at both opposing ends in an arrangement direction thereof may have a shape obtained by cutting away a portion of a rhombus shape. Similarly, each of the second sensor portions SP2 except for the second sensor portions SP2 disposed at both opposing ends in an arrangement direction thereof may have the rhombus shape, while each of the second sensor portions SP2 disposed at both opposing ends in an arrangement direction thereof may have the shape obtained by cutting away a portion of a rhombus shape. Each of the first sensor portions SP1 of the rhombus shape and each of the second sensor portions SP2 of the rhombus shape may have substantially the same size and shape. Each of the first sensor portions SP1 having the shape obtained by cutting away a portion of a rhombus shape and each of the second sensor portions SP2 having the shape obtained by cutting away a portion of a rhombus shape may have substantially the same size and shape. However, the present disclosure is not limited thereto. The shape and size of each of the first sensor portion SP1 and the second sensor portion SP2 may be variously modified.

Figure 12:
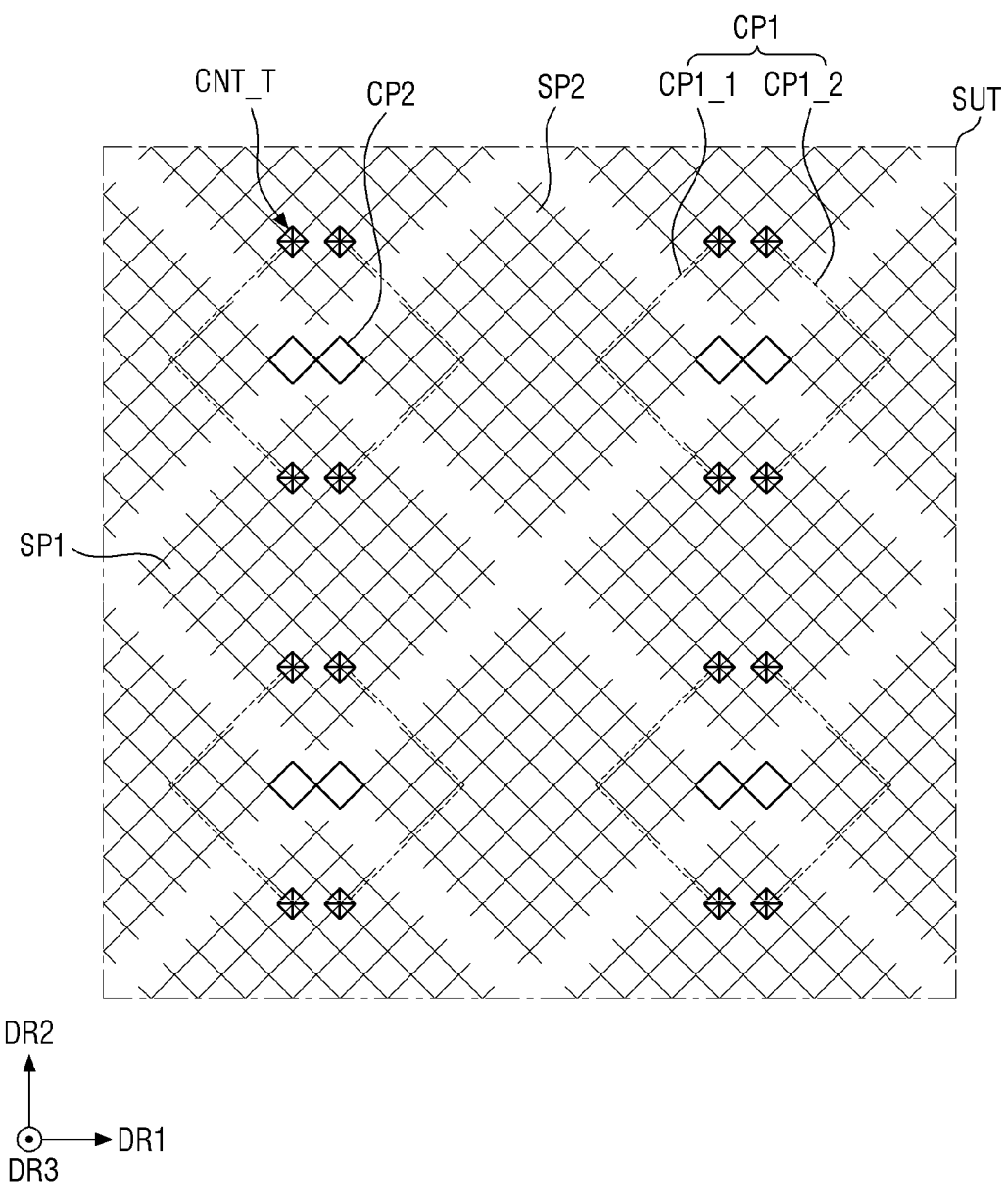
FIG. 12 is an enlarged view of a portion of a display area according to one embodiment.
Figure 13:
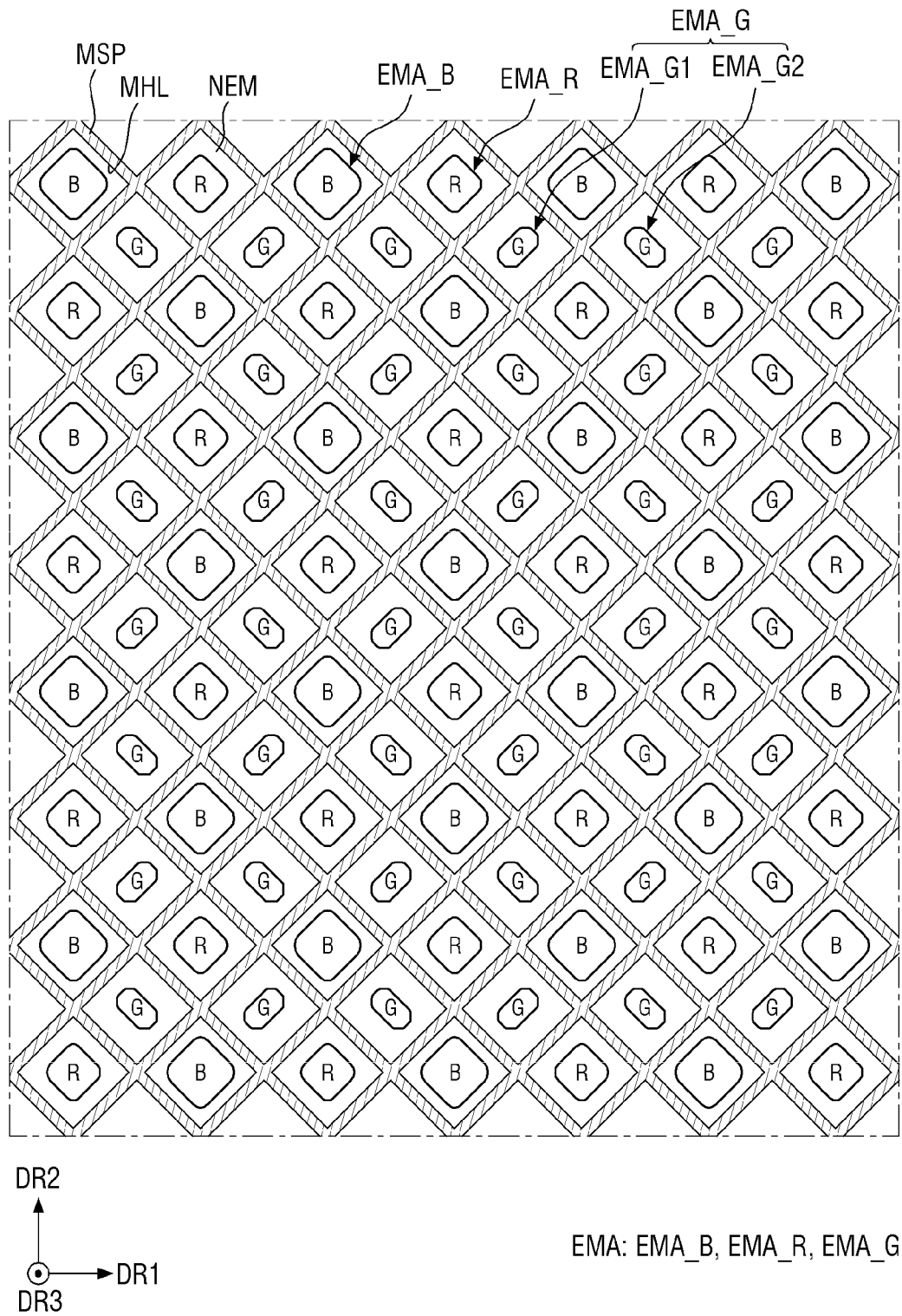
FIG. 13 is a layout diagram showing a relative arrangement relationship between a pixel of a display panel and a mesh pattern of a touch sensor according to one embodiment.

The first sensor portions SP1 of the first sensing electrode IE1 may include a planar pattern or a mesh pattern. The second sensor portions SP2 of the second sensing electrode IE2 may include a planar pattern or a mesh pattern. When the first sensor portions SP1 include a planar pattern and the second sensor portions SP2 include a planar pattern, each of the first sensor portion SP1 and the second sensor portion SP2 may be embodied as a transparent conductive layer. Alternatively, the first sensor portions SP1 include a mesh pattern formed along the non-light emitting area as illustrated in FIG. 12 and FIG. 13, and the second sensor portions SP2 include a mesh pattern formed along the non-light emitting area as illustrated in FIG. 12 and FIG. 13. In this case, when each of the first and second sensor portions SP1 and SP2 includes an opaque low-resistance metal, the mesh pattern may not interfere with propagation of light emitting from the light emissive layer. In following descriptions, a case in which the first sensor portions SP1 include a mesh pattern and the second sensor portions SP2 include a mesh pattern will be described by way of example. The present disclosure is not limited thereto.

The first connection portion CP1 may connect corners of rhombuses or triangles of neighboring first sensor portions SP1 to each other. The second connection portion CP2 may connect corners of rhombuses or triangles of neighboring second sensor portions SP2 to each other.

The first sensing electrode IE1 and the second sensing electrode IE2 may be insulated from each other and may intersect with each other. In an area where the first sensing electrode IE1 and the second sensing electrode IE2 intersect each other, one of the first sensor portions SP1 adjacent to each other in the second direction DR2 and the second sensor portions SP2 adjacent to each other in the first direction DR2 are connected to each other via a conductive layer located at a different vertical level from a vertical level of each of the first sensing electrode IE1 and the second sensing electrode IE2, thereby ensuring the insulation between the first sensing electrode IE1 and the second sensing electrode IE2. The intersection and the insulation between the first sensing electrode IE1 and the second sensing electrode IE2 may be achieved using the first connection portion CP1 and/or the second connection portion CP2. For the insulating and intersection therebetween, at least one of the first connection portion CP1 and the second connection portion CP2 may be located at a different vertical level from a vertical level of each of the first sensing electrode IE1 and the second sensing electrode IE2.

In one example, the first sensor portion SP1 of the first sensing electrode IE1 and the second sensor portion SP2 of the second sensing electrode IE2 may be respectively embodied as conductive layers located at the same vertical level. The first sensor portion SP1 and the second sensor portion SP2 may not intersect or overlap each other. The first sensor portion SP1 and the second sensor portion SP2 adjacent to each other may be physically spaced apart from each other.

The second connection portion CP2 and the second sensor portion SP2 may include the same conductive layer. The second connection portion CP2 may connect second sensor portions SP2 adjacent to each other along the first direction DR1. Adjacent first sensor portions SP1 of the first sensing electrode IE1 may be physically spaced apart from each other with the second connection portion CP2 disposed therebetween. The first connection portion CP1 for connecting the first sensor portions SP1 to each other and the first sensor portion SP1 may include different conductive layers, respectively. The first connection portion CP1 may extend along the area of the second sensing electrode IE2. The first connection portion CP1 may electrically connect first sensor portions SP1 adjacent each other along the second direction via contact holes formed in an insulating layer disposed between the first connection portion CP1 and the first sensor portions SP1, the second sensor portions SP2 and the second connection portion CP2.

The first connection portion CP1 may include a plurality of first connection portions. For example, the first connection portion CP1 may include one first connection portion CP1_1 overlapping the second sensing electrode IE2 adjacent thereto in the opposite to the first direction DR1 and another first connection portion CP1_2 overlapping the second sensing electrode IE2 adjacent thereto in the first direction DR1. However, the present disclosure is not limited thereto. When the first connection portion CP1 connecting two adjacent first sensor portions SP1 includes the plurality of first connection portions, even when one first connection portion CP1_1 is disconnected due to static electricity or the like, disconnection of the corresponding first sensing electrode IE1 may be prevented due to another first connection portion CP1_2.

The active area AAR (or touch area) may further include a row area RW: RW1, RW2, RW3, RW4, RW5, RW6, and RW7 and a column area CL: CL1, CL2, CL3, CL4, CL5, CL6, and CL7. The row area RW may include a plurality of row areas. The column area CL may include a plurality of column areas. The active area AAR may include a plurality of row areas having substantially the same width in the second direction DR2. Each row area may extend in the first direction DR1. The plurality of row areas may be arranged along the second direction DR2. The active area AAR may include a plurality of column areas having substantially the same width in the first direction DR1. Each column area may extend in the second direction DR2. The plurality of column areas may be arranged along the first direction DR1.

One second sensing electrode IE2 may be disposed in each row area RW. One third sub-sensing electrode IE21 and one fourth sub-sensing electrode IE22 may be disposed in each row area RW. For example, the row area RW could include first to seventh row areas RW1, RW2, RW3, RW4, RW5, RW6, and RW7. In this case, one second sensing electrode IE2 may be disposed in each of the first to seventh row areas RW1, RW2, RW3, RW4, RW5, RW6, and RW7.

Lengths of the first to seventh row areas RW1, RW2, RW3, RW4, RW5, RW6, and RW7 in the first direction DR1 may be different from each other. The widths of the first to seventh row areas RW1, RW2, RW3, RW4, RW5, RW6, and RW7 in the second direction DR2 may be substantially equal to each other. The present disclosure is not limited thereto.

One first sensing electrode IE1 may be disposed in each column area CL. One first sub-sensing electrode IE11 and one second sub-sensing electrode IE12 may be disposed in each column area CL. For example, the column area CL may include first to seventh column areas CL1, CL2, CL3, CL4, CL5, CL6, and CL7. In this case, one first sensing electrode IE1 may be disposed in each of the first to seventh column areas CL1, CL2, CL3, CL4, CL5, CL6, and CL7.

Lengths of the first to seventh column areas CL1, CL2, CL3, CL4, CL5, CL6, and CL7 in the second direction DR2 may be different from each other. The widths of the first to seventh column areas CL1, CL2, CL3, CL4, CL5, CL6, and CL7 in the first direction DR1 may be substantially the same as each other. The present disclosure is not limited thereto.

A unit sensing area SUT may be disposed in an area (intersection area OA) where the row area RW and the column area CL intersect with each other. In other words, the unit sensing area SUT may be disposed in an intersection area between one among the first to seventh row areas RW1, RW2, RW3, RW4, RW5, RW6, and RW7 and one among the first to seventh column areas CL1, CL2, CL3, CL4, CL5, CL6, and CL7.

For example, the unit sensing area SUT may be disposed in an area where the fourth row area RW4 and the fourth column area CL4 overlap each other. In an area where the fourth row area RW4 and the fourth column area CL4 overlap each other, the first sensing electrode IE1 and the second sensing electrode IE2 may intersect with each other. In other words, in the area where the fourth row area RW4 and the fourth column area CL4 overlap each other, each of the first sub-sensing electrode IE11 and the second sub-sensing electrode IE12 of the first sensing electrode IE1 may intersect with both of the third sub-sensing electrode IE21 and the fourth sub-sensing electrode IE22 of the second sensing electrode IE2.

In the active area AAR, sizes of the intersection areas between the row areas RW and the column areas CL may be different from each other. Hereinafter, the intersection area refers to a portion of the active area AAR where the row area RW and the column area CL intersect with each other.

For example, sizes of a plurality of first intersection areas OA1 in which the second to sixth row areas RW2, RW3, RW4, RW5, and RW6 and the second to sixth column areas CL2, CL3, CL4, CL5, and CL6 respectively intersect with each other may be substantially identical to each other.

A first row-second column intersection area OA12, a first row-third column intersection area OA13, a first row-fourth column intersection area OA14, a first row-fifth column intersection area OA15, and a first row-sixth column intersection area OA16 in which the first row area RW1 intersects with the second to sixth column areas CL2, CL3, CL4, CL5, and CL6 respectively may have different planar areas. However, the first row-second column intersection area OA12 and the first row-sixth column intersection area OA16 may have the same planar area. The first row-third column intersection area OA13 and the first row-fifth column intersection area OA15 may have the same planar area.

A seventh row-second column intersection area OA72, a seventh row-third column intersection area OA73, a seventh row-fourth column intersection area OA74, a seventh row-fifth column intersection area OA75 and a seventh row-sixth column intersection area OA76 in which the seventh row area RW7 intersects with the second to sixth column areas CL2, CL3, CL4, CL5, and CL6 respectively may have different planar areas. However, the seventh row-second column intersection area OA72 and the seventh row-sixth column intersection area OA76 may have the same planar area. The seventh row-third column intersection area OA73 and the seventh row-fifth column intersection area OA75 may have the same planar area.

A second row-first column intersection area OA21, a third row-first column intersection area OA31, a fourth row-first column intersection area OA41, a fifth row-first column intersection area OA51, and a sixth row-first column intersection area OA61 in which the first column area CL1 intersects with the second to sixth row areas RW2, RW3, RW4, RW5, RW6 respectively may have different planar areas. However, the second row-first column intersection area OA21 and the sixth row-first column intersection area OA61 may have the same planar area. The third row-first column intersection area OA31 and the fifth row-first column intersection area OA51 may have the same planar area.

A second row-seventh column intersection area OA27, a third row-seventh column intersection area OA37, a fourth row-seventh column intersection area OA47, a fifth row-seventh column intersection area OA57, and a sixth row-seventh column intersection area OA67 in which the seventh column area CL7 intersects with the second to sixth row areas RW2, RW3, RW4, RW5, and RW6 respectively may have different planar areas. However, the second row-seventh column intersection area OA27 and the sixth row-seventh column intersection area OA67 may have the same planar area. The third row-seventh column intersection area OA37 and the fifth row-seventh column intersection area OA57 may have the same planar area.

The first row-second column intersection area OA12 may have substantially the same area as each of the seventh row-second column intersection area OA72, the second row-first column intersection area OA21, and the second row-seventh column intersection area OA27. The first row-third column intersection area OA13 may have substantially the same area as each of the seventh row-third column intersection area OA73, the third row-first column intersection area OA31, and the third row-seventh column intersection area OA37. The first row-fourth column intersection area OA14 may have substantially the same area as each of the seventh row-fourth column intersection area OA, the fourth row-first column intersection area OA41, and the fourth row-seventh column intersection area OA47.

The planar area of the first row-second column intersection area OA12 may be within a range of 20% to 50% of the planar area of the first intersection area OA1, or may be 38% thereof. The planar area of the first row-third column intersection area OA13 may be within a range of 75% to 95% of the planar area of the first intersection area OA1, or may be 87% thereof. The planar area of the first row-fourth column intersection area OA14 may be in a range of 95% to 100% of the planar area of the first intersection area OA1.

The active area AAR may not be disposed in an area where the first row area RW1 and each of the first column area CL1 and the seventh column area CL7 overlap each other, and in an area where the seventh row area RW7 and each of the first column area CL1 and the seventh column area CL7 overlap each other. The present disclosure is not limited thereto.

The active area AAR may further include an inner area IS and an outer area OS: OS1, OS2, OS3, OS4. When the active area AAR includes a circular shape, the inner area IS may include the largest rectangular shape within a circle of the active area AAR. In other words, the inner area IS may include a rectangular shape in a plan view, and a vertex where adjacent edges of the inner area IS meet with each other may be located at a circular border of the active area AAR. When active area AAR includes a circular shape and the inner area IS includes a rectangular shape, a diagonal length of the inner area IS may be substantially equal to a diameter of the circular shape of the active area AAR. Further, in this case, a center point where two diagonal lines of the inner area IS intersect each other may be substantially the same as a center point of the active area AAR. The inner area IS may include a square shape. The present disclosure is not limited thereto.

The outer area OS includes a first outer area OS1 and a second outer area OS2 respectively disposed at one side and the opposite side of the inner area IS in the first direction DR1, and a third outer area OS3 and a fourth outer area OS4 respectively disposed at one side and the opposite side of the inner area IS in the second direction DR2. Each of the outer areas OS1, OS2, OS3, and OS4 may be an area enclosed by a circular arc and a line connecting distal ends of the circular arc. A line connecting distal ends of the circular arc may be disposed to overlap one side of the inner area IS The outer areas OS1, OS2, OS3, and OS4 may have substantially the same planar shape. The outer areas OS may surround the inner area IS. The outer areas OS1, OS2, OS3, and OS4 may be spaced apart from each other via the inner area IS. The present disclosure is not limited thereto.

The inner area IS may include a plurality of first intersection areas OA1. The first outer area OS1 may include the second row-seventh column intersection area OA27, the third row-seventh column intersection area OA37, the fourth row-seventh column intersection area OA47, the fifth row-seventh column intersection area OA57, and the sixth row-seventh column intersection area OA67. The second outer area OS2 may include a second row-first column intersection area OA21, the third row-first column intersection area OA31, the fourth row-first column intersection area OA41, the fifth row-first column intersection area OA51, and the sixth row-first column intersection area OA61. The third outer area OS3 may include the first row-second column intersection area OA12, the first row-third column intersection area OA13, the first row-fourth column intersection area OA14, the first row-fifth column intersection area OA15, and the first row-sixth column intersection area OA16. The fourth outer area OS4 may include the seventh row-second column intersection area OA72, the seventh row-third column intersection area OA73, the seventh row-fourth column intersection area OA74, the seventh row-fifth column intersection area OA75, and the seventh row-sixth column intersection area OA76.

Sizes of the intersection areas OA may be different from each other. In other words, sizes of the plurality of intersection areas OA disposed in the inner area IS may be substantially the same as each other, while sizes of the intersection areas OA disposed in the outer area OS may be different from each other, while a size of each of the intersection areas OA disposed in the outer area OS may be different from a size of each of the intersection areas OA disposed in the inner area IS. The sizes of the intersection areas OA disposed in the outer area OS may decrease as a distance from a center of the outer area OS increases.

A unit sensing area SUT may be located in each intersection area OA. The first sensor portion SP1 and the second sensor portion SP2 adjacent to each other may constitute a unit sensing area SUT. A size of the unit sensing area SUT disposed in each intersection area OA may correspond to a size of each intersection area OA.

For example, an area formed by lines bisecting the first sub-sensing electrode IE11 and the second sub-sensing electrode IE12 along the first direction DR1 and lines bisecting the third sub-sensing electrode IE21 and the fourth sub-sensing electrode IE22 along the second direction DR2 may constitute one unit sensing area SUT (FIG. 10).

In other words, each of the plurality of unit sensing area SUTs in the inner area IS may include ½ of each of first sensor portions SP1 of two first sub-sensing electrodes IE11 adjacent to an area where the first sensing electrode IE1 and the second sensing electrode IE2 intersect with each other, ½ of each of first sensor portions SP1 of two second sub-sensing electrodes IE12 adjacent thereto, ½ of each of second sensor portions SP2 of two adjacent third sub-sensing electrodes IE21 adjacent thereto, ½ of each of second sensor portions SP2 of two fourth sub-sensing electrodes IE22 adjacent thereto, a first sensor portion SP1 of an entirety of one first sub-sensing electrode IE11, a first sensor portion SP1 of an entirety of one second sub-sensing electrode IE12, and a second sensor portion SP2 of an entirety of one third sub-sensing electrode IE21, and a second sensor portion SP2 of an entirety of one fourth sub-sensing electrode IE22.

A planar shape of the unit sensing area SUT disposed in the outer area OS may be different from a planar shape of the unit sensing area SUT disposed in the inner area IS. The planar shape of the unit sensing area SUT located in the inner area IS may correspond to that of the intersection area OA located in the inner area IS. The planar shape of the unit sensing area SUT located in the outer area OS may correspond to that of the intersection area OA located in the outer area OS. The planar shape of the unit sensing area SUT located in the outer area OS may include a planar shape obtained by partially cutting the planar shape of the unit sensing area SUT located in the inner area IS corresponding to the planar shape of the outer area OS.

In each unit sensing area SUT, change in capacitance between the first sensor portion SP1 and the second sensor portion SP2 adjacent to each other may be sensed. Thus, whether a touch is occurred or not may be determined based on the change and a position of the touch may be calculated as a touch input coordinate. Touch sensing may be achieved in a mutual capacitance (Cm) scheme. The present disclosure is not limited thereto. A size of each unit sensing area SUT may be larger than a pixel size. For example, the unit sensing area SUT may correspond to a plurality of pixels. A plurality of unit sensing area SUTs may be disposed along the first direction DR1 and the second direction DR2.

The first sensing electrode IE1 includes the first sub-sensing electrode IE11 and the second sub-sensing electrode IE12 at least partially spaced apart from each other. The second sensing electrode IE2 includes the third sub-sensing electrode IE21 and the fourth sub-sensing electrode IE22 that are at least partially spaced apart from each other. Thus, a touch sensitivity of the touch sensor may be improved, and touch failure that may occur in the outer area OS may be suppressed or prevented.

In other words, the first sensing electrode IE1 includes the first sub-sensing electrode IE11 and the second sub-sensing electrode IE12 at least partially spaced apart from each other, and the second sensing electrode IE2 includes the third sub-sensing electrode IE21 and the fourth sub-sensing electrode IE22 that are at least partially spaced apart from each other. Each of the first sub-sensing electrode IE11 and the second sub-sensing electrode IE12 intersects with the third sub-sensing electrode IE21 and the fourth sub-sensing electrode IE22. Thus, a boundary between the first sensing electrode IE1 and the second sensing electrode IE2 may increase. When the boundary between the first sensing electrode IE1 and the second sensing electrode IE2 increases, the mutual capacitance between the first sensing electrode IE1 and the second sensing electrode IE2 may increase, such that the touch sensitivity of the touch sensor may be improved, and performance of the touch sensor may be improved.

In particular, when the active area AAR includes a circular shape, an area of each of the first sensing electrode IE1 and the second sensing electrode IE2 disposed in the outer area OS may be smaller than an area of each of the first sensing electrode IE1 and the second sensing electrode IE2 disposed in the inner area IS. A boundary between the first sensing electrode IE1 and the second sensing electrode IE2 disposed in the outer area OS may be smaller than a boundary between the first sensing electrode IE1 and the second sensing electrode IE2 disposed in the inner area OS. As each of the first sensing electrode IE1 and the second sensing electrode IE2 in the outer area OS includes two sub-sensing electrodes at least partially spaced apart from each other, the boundary between the first sensing electrode IE1 and the second sensing electrode IE2 may be increased. Thus, a touch sensitivity of the active area AAR disposed in the outer area OS may be improved. Therefore, even when the active area AAR includes the circular shape, touch failure that may occur in the outer area OS may be suppressed or prevented.

TABLE 1

|  | Comparative Example | | Present Example | |
| --- | --- | --- | --- | --- |
| Intersection area | OA1 | OA16 | OA1 | OA16 |
| Mutual capacitance (femto farad, fF) | 563 | 79 | 1095 | 358 |

Referring to Table 1, Comparative Example corresponds to a case in which each of the first sensing electrode IE1 and the second sensing electrode IE2 includes two sub-sensing electrodes at least partially spaced apart from each other but is integrally formed. In this case, one first sensing electrode IE1 and one second sensing electrode IE2 intersect each other in each unit sensing area SUT. In the Comparative Example, each of the first sensing electrode IE1 and the second sensing electrode IE2 may be integrally formed in each of the first intersection area OA1 and the first row-sixth column intersection area OA16.

Present Example based on the embodiment of the present disclosure as described above corresponds to a case in which the first sensing electrode IE1 includes the first sub-sensing electrode IE11 and the second sub-sensing electrode IE12 which is at least partially spaced apart from each other, and the second sensing electrode IE2 includes the third sub-sensing electrode IE21 and the fourth sub-sensing electrode IE22 at least partially spaced apart from each other. In the Present Example, each of the first intersection area OA1 and the first row-sixth column intersection area OA16 includes the first sub-sensing electrode IE11, the second sub-sensing electrode IE12, the third sub-sensing electrode IE21, and the fourth sub-sensing electrode IE22.

When comparing the Comparative Example and the Present Example with each other regarding the first area OA1, a mutual capacitance measured in the first area OA1 of the Comparative Example is 563 fF, while a mutual capacitance measured in the first area OA1 of the Present Example is 1095 fF. That is, the mutual capacitance in the Present Example is larger than that in the Comparative Example.

When comparing the Comparative Example and the Present Example with each other regarding the first row-sixth column intersection area OA16, a mutual capacitance measured in the first row-sixth column intersection area OA16 in the Comparative Example is 79 fF, while a mutual capacitance measured in the first row-sixth column intersection area OA16 in the Present Example is 358 fF. That is, the mutual capacitance in the Present Example is larger than that in the Comparative Example.

Accordingly, as the first sensing electrode IE1 includes the first sub-sensing electrode IE11 and the second sub-sensing electrode IE12 at least partially spaced apart from each other, and the second sensing electrode IE2 includes the third sub-sensing electrode IE21 and the fourth sub-sensing electrode IE22 at least partially spaced apart from each other, the mutual capacitance increases.

A plurality of touch signal lines may be disposed in the non-active area NAR outside the touch area. The touch signal line may extend from a touch pad area TPA. The touch pad area TPA may be located in the sub-area SA (see FIG. 1). That is, the touch signal line may extend from the touch pad area TPA located in the sub-area SA (see FIG. 1) through the bending area BA (see FIG. 1) to the non-active area NAR of the main area MA (see FIG. 1).

The touch sensor may further include a plurality of touch signal lines disposed in the non-touch area. The plurality of touch signal lines includes a plurality of touch driving lines Tx and a plurality of touch sensing lines Rx. In some other embodiments, the plurality of touch signal lines may further include a touch ground line and/or a touch anti-static line.

The touch driving line Tx may be connected to the first sensing electrode IE1. In one embodiment, a plurality of touch driving lines may be connected to one first sensing electrode IE1. For example, the touch driving line may include each first touch driving line Tx1_1, Tx2_1, Tx3_1, Tx4_1, Tx5_1, Tx6_1, and Tx7_1 connected to a lower end of each first sensing electrode IE1, and each second touch driving line connected to an upper end of each first sensing electrode IE1 Tx1_2, Tx2_2, Tx3_2, Tx4_2, Tx5_2, Tx6_2, and Tx7_2. Each first touch driving line Tx1_1, Tx2_1, Tx3_1, Tx4_1, Tx5_1, Tx6_1, and Tx7_1 may extend from the touch pad area TPA to one side in the second direction DR2 and may be connected to the lower end of each first sensing electrode TE1. Each second touch driving line Tx1_2, Tx2_2, Tx3_2, Tx4_2, Tx5_2, Tx6_2, and Tx7_2 may extend from the touch pad area TPA to one side in the second direction DR2, and may bypass a left side of the touch area and may be connected to the upper end of each first sensing electrode IE1.

The first sub-sensing electrode IE11 and the second sub-sensing electrode IE12 of each first sensing electrode IE1 may be connected to the same touch driving line Tx. In other words, both of the first sub-sensing electrode IE11 and the second sub-sensing electrode IE12 of one first sensing electrode IE1 may be connected to one of the first touch driving lines Tx1_1, Tx2_1, Tx3_1, Tx4_1, Tx5_1, Tx6_1, and Tx7_1, and may be connected to one of the second touch driving lines Tx1_2, Tx2_2, Tx3_2, Tx4_2, Tx5_2, Tx6_2, and Tx7_2.

The touch sensing line Rx may be connected to the second sensing electrode IE2. In one embodiment, one touch sensing line Rx may be connected to one second sensing electrode IE2. Each of the touch sensing lines Rx1, Rx2, Rx3, Rx4, Rx5, Rx6, and Rx7 may extend from the touch pad area TPA to one side in the second direction DR2, and may extend to a right edge of the touch area, and may be connected to a right end of each of the second sensing electrodes IE2. The touch sensing lines Rx1, Rx2, Rx3, Rx4, Rx5, Rx6, and Rx7 may be spaced apart from each other along the first direction DR1.

The third sub-sensing electrode IE21 and the fourth sub-sensing electrode IE22 of each of the second sensing electrodes IE2 may be connected to the same touch sensing line Rx. In other words, both of the third sub-sensing electrode IE21 and the fourth sub-sensing electrode IE22 of each of the second sensing electrodes IE2 may be connected to one of the touch sensing lines Rx1, Rx2, Rx3, Rx4, Rx5, Rx6, and Rx7.

Figure 11:
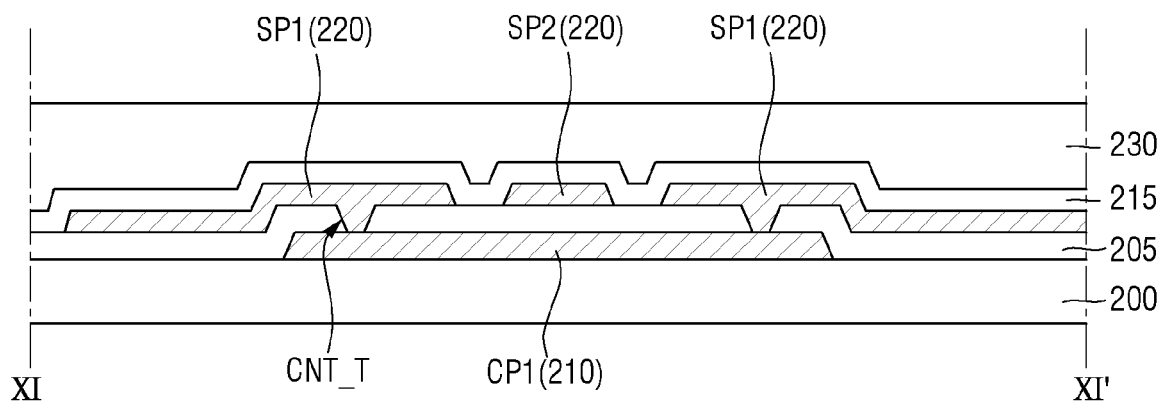
FIG. 11 is a cross-sectional view taken along a line XI-XI' in FIG. 10.

FIG. 11 is a cross-sectional view taken along a line XI-XI' in FIG. 10.

Referring to FIG. 10 and FIG. 11, the first connection portion CP1 may include a first touch conductive layer 210. Each of the first sensor portion SP1, the second sensor portion SP2, and the second connection portion CP2 may include a second touch conductive layer 220. A first touch insulating layer 205 may be disposed between the first connection portion CP1 and each of the first sensor portion SP1, the second sensor portion SP2, and the second connection portion CP2. The first sensor portion SP1 may overlap with the first connection portion CP1. In the intersection area, the first sensor portion SP1 may contact the first connection portion CP1 via a contact hole CNT_T that extends through the first touch insulating layer 205 in a thickness direction thereof and exposes a portion of the first connection portion CP1. Accordingly, the first sensor portions SP1 adjacent to each other may be electrically connected to each other.

However, the present disclosure is not limited thereto. In another example, the first connection portion CP1 may include the second touch conductive layer 220, while each of the sensor portions SP1 and SP2 and the second connection portion CP2 may include the first touch conductive layer 210. The touch signal line may include the first touch conductive layer 210 or the second touch conductive layer 220, or may include the first touch conductive layer 210 and the second touch conductive layer 220 connected to each other via a contact. In addition, the touch conductive layer constituting each member of the signal line or the sensing electrode may be variously modified.

FIG. 12 is an enlarged view of a portion of a touch area according to one embodiment. FIG. 13 is a layout diagram showing a relative arrangement relationship between the pixel of the display panel and the mesh pattern of the touch sensor according to one embodiment.

Referring to FIG. 12 and FIG. 13, the display area of the active area AAR includes a plurality of pixels. Each pixel includes a light-emitting area EMA. The pixel may include a first color pixel (e.g., a red pixel), a second color pixel (e.g., a blue pixel), and a third color pixel (e.g., a green pixel). The light-emitting area EMA may include light-emitting areas EMA_R, EMA_B, and EMA_G (EMA_G1 and EMA_G2). A shape of the light-emitting area EMA of each color pixel may be generally an octagon, a rectangle with rounded corners, or a rhombus shape. The present disclosure is not limited thereto.

A non-light emitting area NEM may be disposed between the light-emitting areas EMA of the pixels. The non-light emitting area NEM may surround the light-emitting area EMA. The non-light emitting area NEM has a grid shape or a mesh shape extending along diagonal directions intersecting with the first direction DR1 and the second direction DR2 in a plan view.

A mesh pattern MSP may be disposed in the non-light emitting area NEM. The mesh pattern MSP may be substantially the same as at least one of the first touch conductive layer 210 or the second touch conductive layer 220 as described in FIG. 6 to FIG. 10.

The mesh pattern MSP may be disposed along a boundary between the pixels and in the non-light emitting area NEM. The mesh pattern MSP may not overlap the light-emitting area EMA. A width of the mesh pattern MSP may be smaller than a width of the non-light emitting area NEM. In one embodiment, a mesh hole MHL exposed through the mesh pattern MSP may have a substantially rhombus shape. Sizes of the mesh holes MHL may be equal to each other or may be different from each other based on a size of the light-emitting area EMA exposed through a corresponding mesh hole MHL, and may be different from each other regardless of a size of the light-emitting area EMA exposed through a corresponding mesh hole MHL. In the drawing, a case in which one mesh hole MHL corresponds to one light-emitting area EMA is exemplified. However, the present disclosure is not limited thereto. One mesh hole MHL may correspond to at least two light-emitting areas EMA.

Hereinafter, other embodiments will be described. In following embodiments, descriptions of the same components as those in the already described embodiment will be omitted or simplified. Following descriptions will be focused on differences therebetween.

Figure 14:
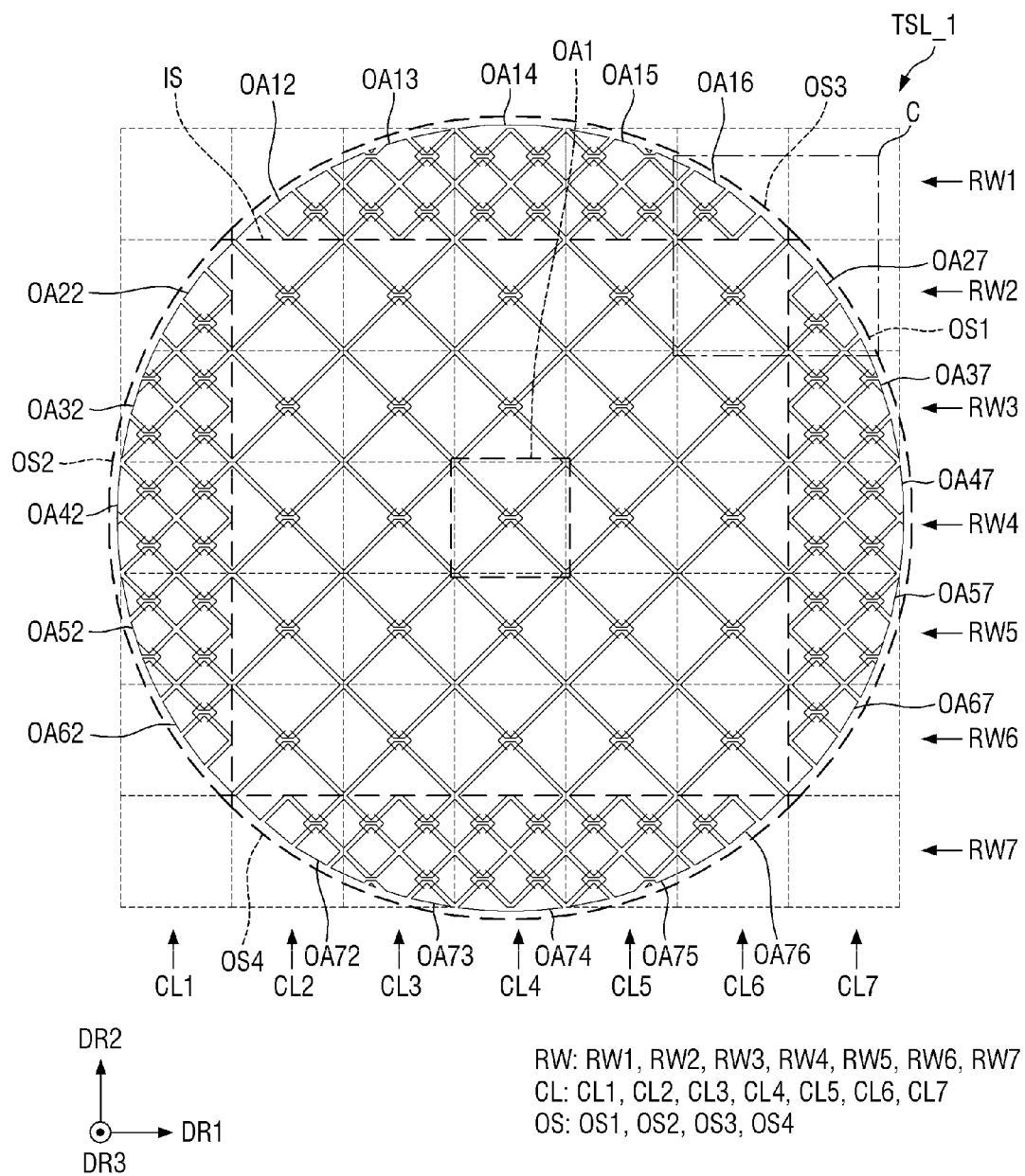
FIG. 14 is a schematic plan view of a touch layer according to another embodiment.
Figure 15:
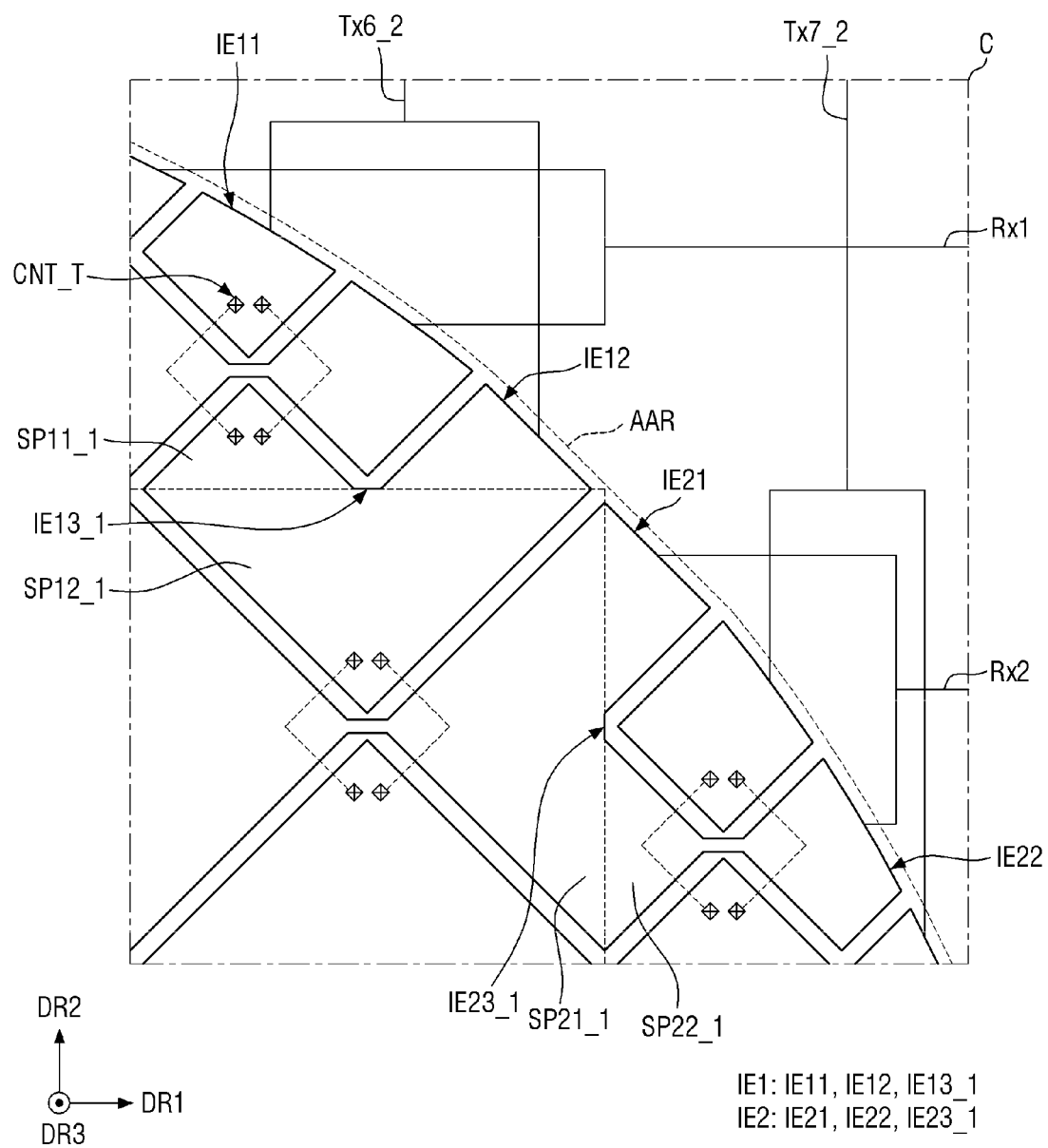
FIG. 15 is an enlarged view of an area C of FIG. 14.

FIG. 14 is a schematic plan view of a touch layer according to another embodiment. FIG. 15 is an enlarged view of an area C of FIG. 14.

Referring to FIG. 14 and FIG. 15, this embodiment is different from the embodiment in FIG. 8 in that in a touch layer TSL_1 according to this embodiment, each of one first sensing electrode IE1 and one second sensing electrode IE2 in the outer area OS may include sub-sensing electrodes at least partially spaced from each other.

Specifically, the first sensing electrode IE1 of the touch layer TSL_1 further includes a fifth sub-sensing electrode IE13_1 disposed in the inner area IS. The second sensing electrode IE2 thereof may further include a sixth sub-sensing electrode IE23_1 disposed in the inner area IS. The first sub-sensing electrode IE11 and the second sub-sensing electrode IE12 may be disposed in the outer area OS and may be connected to the fifth sub-sensing electrode IE13_1. The third sub-sensing electrode IE21 and the fourth sub-sensing electrode IE22 may be disposed in the outer area OS and may be connected to the sixth sub-sensing electrode IE23_1.

The first sub-sensing electrode IE11 and the second sub-sensing electrode IE12 may protrude from the fifth sub-sensing electrode IE13_1 toward the same direction (e.g., toward one side and/or the opposite side in the second direction DR2). The third sub-sensing electrode IE21 and the fourth sub-sensing electrode IE22 may protrude from the sixth sub-sensing electrode IE23_1 toward the same direction (e.g., toward one side and/or the opposite side in the first direction DR1).

Each of the first sub-sensing electrode IE11 and the second sub-sensing electrode IE12 may include a first sub-sensor portion SP11_1. The fifth sub-sensing electrode IE13_1 may include a second sub-sensor portion SP12_1. The first sub-sensor portion SP11_1 may be substantially the same as the first sensor portion SP1 of one embodiment (see FIG. 7).

The first sub-sensor portion SP11_1 may be disposed in the outer area OS. The second sub-sensor portion SP12_1 may be disposed in the inner area IS. A size of the first sub-sensor portion SP11_1 may be smaller than a size of the second sub-sensor portion SP12_1. For example, the size of the first sub-sensor portion SP11_1 may be in a range of ½ to 1/10 of a size of the second sub-sensor portion SP12_1 or may be ¼ thereof.

The first sub-sensor portion SP11_1 and the second sub-sensor portion SP12_1 may be connected to each other at a boundary between the outer area OS and the inner area IS. For example, at a boundary between a third outer area OS3 and the inner area IS, and at a boundary between a fourth outer area OS4 and the inner area IS, ½ of each of two first sub-sensor portions SP11_1 and ½ of one second sub-sensor portion SP12_1 may be connected to each other. Second sub-sensor portions SP12_1 adjacent to each other of each first sensing electrode IE1 in the inner area IS may be connected to each other via a fourth connection portion.

The first sub-sensor portion SP11_1 disposed in the outer area OS and the second sub-sensor portion SP12_1 disposed in the inner area IS of each first sensing electrode IE1 may be connected to the same touch driving line Tx (see FIG. 7).

The second sensing electrode IE2 of the touch layer TSL_1 may include a third sub-sensor portion SP21_1 and a fourth sub-sensor portion SP22_1. The third sub-sensor portion SP21_1 may be substantially the same as the second sensor portion SP2 of one embodiment (see FIG. 7). The third sub-sensor portion SP21_1 may be disposed in the inner area IS, while the fourth sub-sensor portion SP22_1 may be disposed in the outer area OS. A size of the fourth sub-sensor portion SP22_1 may be smaller than a size of the third sub-sensor portion SP21_1. For example, the size of the fourth sub-sensor portion SP22_1 may be in a range of ½ to 1/10 of the size of the third sub-sensor portion SP21_1 or may be ¼ thereof.

At the boundary between the outer area OS and the inner area IS, the third sub-sensor portion SP21_1 and the fourth sub-sensor portion SP22_1 may be connected to each other. For example, at a boundary between a first outer area OS1 and the inner area IS, and at the boundary between a second outer area OS2 and the inner area IS, ½ of each of two third sub-sensor portions SP21_1 and ½ of one fourth sub-sensor portion SP22_1 may be connected to each other. The fourth sub-sensor portions SP22_1 adjacent to each other of each second sensing electrode IE2 in the inner area IS may be connected to each other via a third connection portion.

The third sub-sensor portion SP21_1 disposed in the inner area IS and the fourth sub-sensor portion SP22_1 disposed in the outer area OS of each second sensing electrode IE2 may be connected to the same touch sensing line Rx (see FIG. 7).

In this case, a touch sensitivity in the outer area OS may be improved. Touch failure that may occur in the outer area OS (in particular, first row-second column intersection area OA12, first row-sixth column intersection area OA16, second row-seventh column intersection area OA27, seventh row-sixth column intersection area OA76, seventh row-second column intersection area OA72, seventh row-sixth column intersection area OA76, second row-second column intersection area OA22, and second row-sixth column intersection area OA26) may be suppressed or prevented. In addition, since a design of the first sensing electrode IE1 and the second sensing electrode IE2 disposed in the inner area IS may be different from a design of the first sensing electrode IE1 and the second sensing electrode IE2 disposed in the outer area OS, various designs may be adopted as required.

Figure 16:
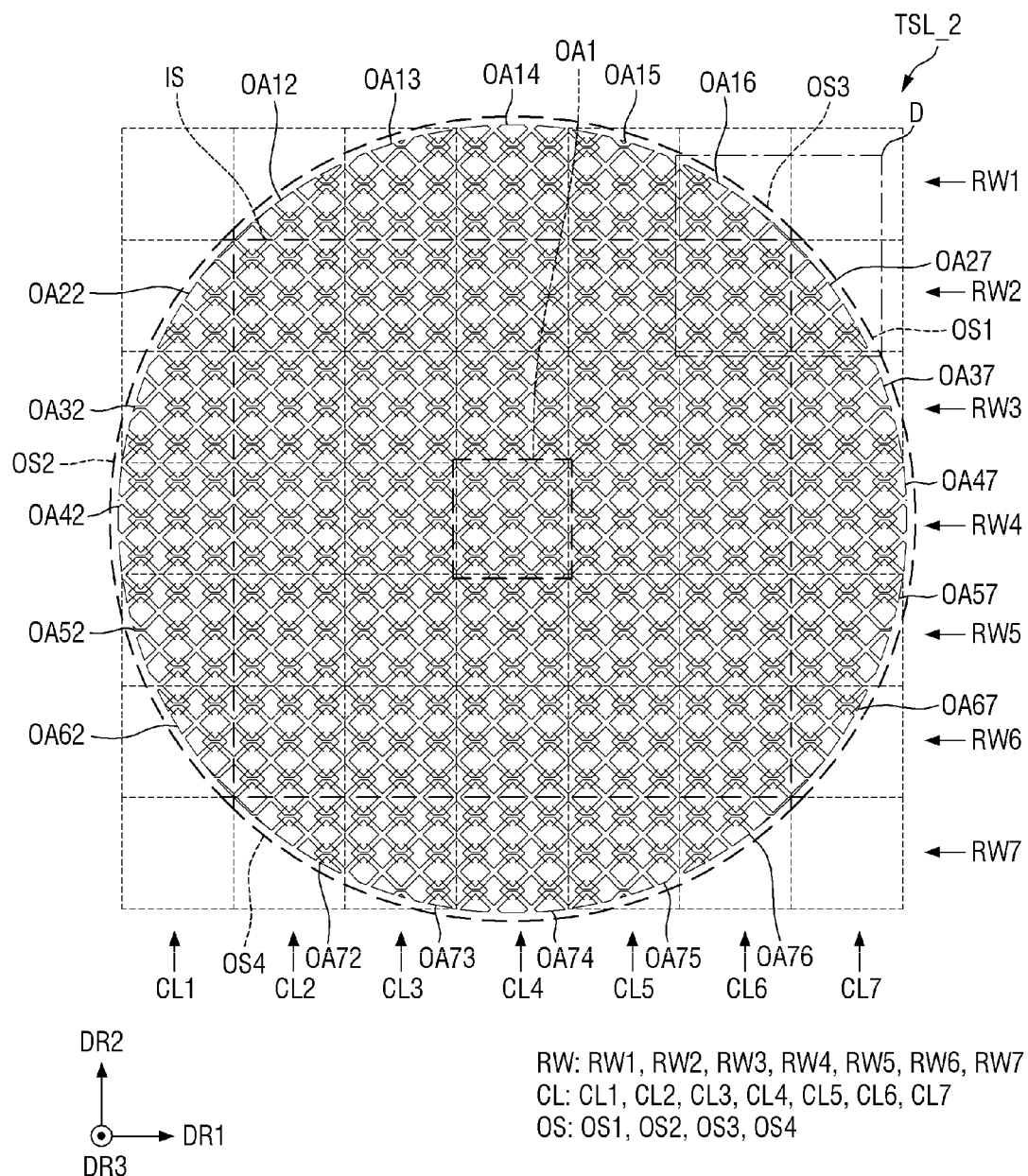
FIG. 16 is a schematic plan view of a touch layer according to still another embodiment.
Figure 17:
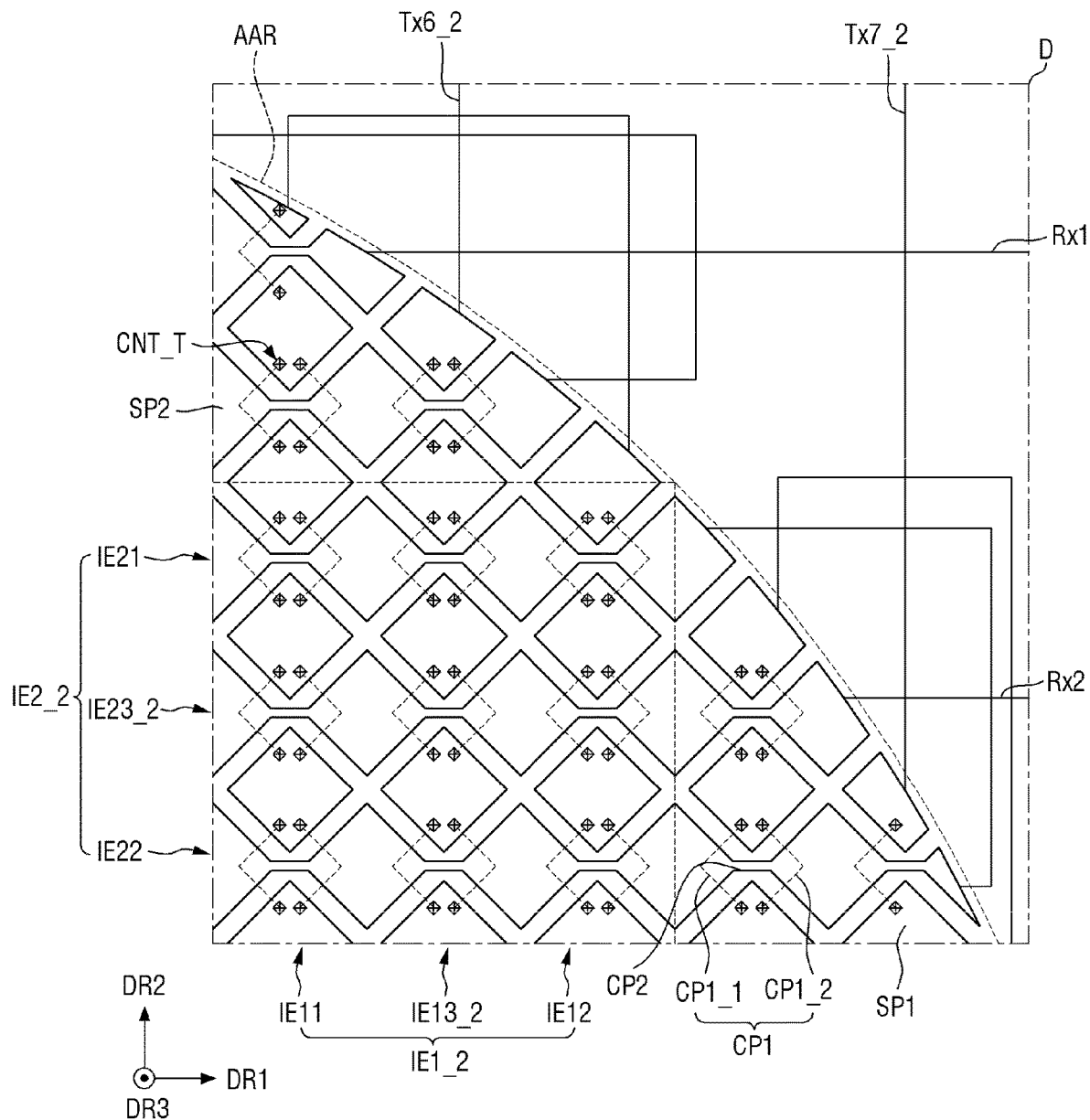
FIG. 17 is an enlarged view of an area D of FIG. 16.

FIG. 16 is a schematic plan view of a touch layer according to still another embodiment. FIG. 17 is an enlarged view of an area D of FIG. 16.

Referring to FIG. 16 and FIG. 17, this embodiment is different from the embodiment in FIG. 8 in that a first sensing electrode IE1_2 of a touch layer TSL_2 according to this embodiment further includes a fifth sub-sensing electrode IE13_2, and a second sensing electrode IE2_2 thereof further includes a sixth sub-sensing electrode IE23_2. The fifth sub-sensing electrode IE13_2 may be disposed between the first sub-sensing electrode IE11 and the second sub-sensing electrode IE12 and may be at least partially spaced apart from each of the first sub-sensing electrode IE11 and the second sub-sensing electrode IE12. The sixth sub-sensing electrode IE23_2 may be disposed between the third sub-sensing electrode IE21 and the fourth sub-sensing electrode IE22, and may be at least partially spaced apart from each of the third sub-sensing electrode IE21 and the fourth sub-sensing electrode IE32.

In this case, the touch sensitivity in the outer area OS may be improved. Further, touch failure that may occur in the outer area OS (in particular, first row-second column intersection area OA12, first row-sixth column intersection area OA16, second row-seventh column intersection area OA27, seventh row-sixth column intersection area OA76, seventh row-second column intersection area OA72, seventh row-sixth column intersection area OA76, second row-second column intersection area OA22, and second row-sixth column intersection area OA26) may be suppressed or prevented, In addition, since a design of the first sensing electrode IE1_2 and the second sensing electrode IE2_2 disposed in the inner area IS may be different from a design of the first sensing electrode IE1_2 and the second sensing electrode IE2_2 disposed in the outer area OS, various designs may be adopted as required.

In concluding the detailed description, those skilled in the art will appreciate that many variations and modifications can be made to the preferred embodiments without substantially departing from the principles of the present inventive concept. Therefore, the disclosed preferred embodiments of the inventive concept are used in a generic and descriptive sense only and not for purposes of limitation.

What is claimed is:

1. A display device comprising:
   a touch area having a circular shape and sensing a touch input, the touch area including an inner area having a rectangular shape and an outer area disposed outside of the inner area;
   a first sensing electrode disposed in the touch area and extending in the first direction, the first sensing electrode including:
   a plurality of first sensor patterns disposed in the inner area, a first sub-sensing electrode and a second sub-sensing electrode disposed in the outer area and spaced apart from each other, having the same shape as the first sensor patterns, having an area less than or equal to one fourth of an area of a first sensor pattern, and
a first boundary sensor pattern disposed at a boundary between the inner area and the outer area, and has an area less than or equal to three fourth of an area of a first sensor pattern, and
a second sensing electrode disposed in the touch area and extending in a second direction intersecting the first direction, the second sensing electrode including a plurality of second sensor patterns.

2. The device of claim 1, wherein the first sub-sensing electrode and a second sub-sensing electrode are connected to the first boundary sensor pattern in the outer area.

3. The device of claim 2, wherein the device further comprises a first touch signal line connected to the first sub-sensing electrode and the second sub-sensing electrode.

4. The device of claim 3, wherein the device further comprises a non-touch area disposed around the touch area, wherein the first touch signal line is disposed in the non-touch area.

5. The device of claim 4, wherein the first boundary sensor pattern has a shape from which one fourth of an area of the first sensor pattern disposed in the inner area is removed.

6. The device of claim 1, wherein the plurality of second sensor patterns include a second boundary sensor pattern disposed at a boundary between the inner area and the outer area, and has an area less than or equal to three fourth of an area of a second sensor pattern disposed in the inner area.

7. The device of claim 6, wherein the second sensing electrode includes a third sub-sensing electrode and a fourth sub-sensing electrode disposed in the outer area and spaced apart from each other in the outer area.

8. The device of claim 7, wherein the third sub-sensing electrode and the fourth sub-sensing electrode are connected to the second boundary sensor pattern in the outer area.

9. The device of claim 8, wherein the device further comprises a second touch signal line connected to the third sub-sensing electrode and the fourth sub-sensing electrode.

10. The device of claim 9, wherein the device further comprises a non-touch area disposed around the touch area, wherein the second touch signal line is disposed in the non-touch area.

11. The device of claim 10, wherein the second boundary sensor pattern has a shape from which one fourth of an area of the second sensor pattern disposed in the inner area is removed.

12. A display device comprising:
a touch area having a circular shape and sensing a touch input, the touch area including an inner area having a rectangular shape and an outer area disposed outside of the inner area;
a first sensing electrode disposed in the touch area and extending in the first direction, the first sensing electrode including:
a plurality of first sensor patterns disposed in the inner area,
a first sub-sensing electrode and a second sub-sensing electrode disposed in the outer area and spaced apart from each other, having the same shape as the first sensor patterns, having an area less than or equal to one fourth of an area of a first sensor pattern, and
a first boundary sensor pattern disposed at a boundary between the inner area and the outer area, and has an area less than or equal to three fourth of an area of a first sensor pattern disposed in the inner area, and
a second sensing electrode disposed in the touch area and extending in a second direction intersecting the first direction, the second sensing electrode including:
a plurality of second sensor patterns disposed in the inner area,
a third sub-sensing electrode and a fourth sub-sensing electrode disposed in the outer area and spaced apart from each other, having the same shape as the second sensor patterns, having an area less than or equal to one fourth of an area of a second sensor pattern, and
a second boundary sensor pattern disposed at a boundary between the inner area and the outer area and has an area less than or equal to three fourth of an area of a second sensor pattern disposed in the inner area.

13. The device of claim 12, wherein the first boundary sensor pattern has a shape from which one fourth of an area of the first sensor pattern disposed in the inner area is removed, and
wherein the second boundary sensor pattern has a shape from which one fourth of an area of the second sensor pattern disposed in the inner area is removed.

14. The device of claim 13, wherein, a second sensor pattern having a reduced area is disposed in an area corresponding to the removed portion of the first boundary sensor pattern, and
wherein a first sensor pattern having a reduced area is disposed in an area corresponding to the removed portion of the second boundary sensor pattern.

* * * * *